(12) United States Patent
Sawabe et al.

(10) Patent No.: US 10,658,376 B2
(45) Date of Patent: May 19, 2020

(54) SEMICONDUCTOR DEVICE INCLUDING A BLOCKING LAYER HAVING A VARYING THICKNESS

(71) Applicant: Toshiba Memory Corporation, Minato-ku (JP)

(72) Inventors: Ryosuke Sawabe, Yokkaichi (JP); Shigeru Kinoshita, Yokohama (JP); Kenta Yamada, Yokkaichi (JP); Hirokazu Ishigaki, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/003,763

(22) Filed: Jun. 8, 2018

(65) Prior Publication Data
US 2018/0294279 A1    Oct. 11, 2018

Related U.S. Application Data

(63) Continuation of application No. PCT/JP2016/086725, filed on Dec. 9, 2016.

(30) Foreign Application Priority Data

Dec. 9, 2015 (JP) .................................. 2015-240394

(51) Int. Cl.
*H01L 27/11582* (2017.01)
*H01L 21/28* (2006.01)
(Continued)

(52) U.S. Cl.
CPC .. *H01L 27/11582* (2013.01); *H01L 21/02532* (2013.01); *H01L 21/02636* (2013.01); *H01L 27/1157* (2013.01); *H01L 29/1037* (2013.01); *H01L 29/40117* (2019.08); *H01L 29/513* (2013.01); *H01L 21/0217* (2013.01); *H01L 21/0274* (2013.01); *H01L 21/02164* (2013.01); *H01L 21/02271* (2013.01); *H01L 21/31111* (2013.01); *H01L 21/31116* (2013.01); *H01L 21/32136* (2013.01); *H01L 29/518* (2013.01)

(58) Field of Classification Search
CPC ................................................. H01L 27/11582
See application file for complete search history.

(56) References Cited

U.S. PATENT DOCUMENTS

| 8,829,593 B2 | 9/2014 | Sekine et al. |
| 9,076,824 B2 | 7/2015 | Sakui et al. |
(Continued)

FOREIGN PATENT DOCUMENTS

| JP | 2008-192708 A | 8/2008 |
| JP | 2010-45314 A | 2/2010 |
(Continued)

OTHER PUBLICATIONS

International Search Report dated Feb. 21, 2017 in PCT/JP2016/086725 with English translation, 6 pages.

*Primary Examiner* — Daniel Whalen
(74) *Attorney, Agent, or Firm* — Oblon, McClelland, Maier & Neustadt, L.L.P.

(57) ABSTRACT

According to one embodiment, a semiconductor device includes a substrate, a stacked body, and a columnar portion. The stacked body, provided on the substrate, includes first conductive layers and first insulating layers provided alternately along a first direction. The columnar portion extends through the stacked body in the first direction. The columnar portion includes a blocking layer, a charge storage layer, a tunneling layer, and a semiconductor layer. The columnar portion includes a first portion and a second portion. The second portion is provided on the substrate side of the first portion. A dimension in the second direction of the second portion is smaller than a dimension in a second direction of the first portion. A portion of the blocking layer is provided at the second portion being thicker than a portion of the blocking layer provided at the first portion.

16 Claims, 31 Drawing Sheets

(51) Int. Cl.
    *H01L 27/1157*      (2017.01)
    *H01L 21/02*      (2006.01)
    *H01L 29/10*      (2006.01)
    *H01L 29/51*      (2006.01)
    H01L 21/027      (2006.01)
    H01L 21/311      (2006.01)
    H01L 21/3213      (2006.01)

(56) References Cited

U.S. PATENT DOCUMENTS

| | | |
|---|---|---|
| 2008/0186771 A1 | 8/2008 | Katsumata et al. |
| 2010/0038699 A1 | 2/2010 | Katsumata et al. |
| 2011/0018052 A1 | 1/2011 | Fujiwara et al. |
| 2011/0019480 A1 | 1/2011 | Kito et al. |
| 2011/0049612 A1 | 3/2011 | Higuchi et al. |
| 2014/0010016 A1* | 1/2014 | Higuchi ................ H01L 29/792 365/185.18 |
| 2014/0252453 A1 | 9/2014 | Higuchi et al. |
| 2015/0263036 A1 | 9/2015 | Yasuda et al. |

FOREIGN PATENT DOCUMENTS

| | | |
|---|---|---|
| JP | 2011-23688 A | 2/2011 |
| JP | 2011-29234 A | 2/2011 |
| JP | 2011-49239 A | 3/2011 |
| JP | 2011-66348 A | 3/2011 |
| JP | 4834750 B2 | 12/2011 |
| JP | 2014-13634 A | 1/2014 |
| JP | 2015-177013 A | 10/2015 |
| TW | 201114021 A1 | 4/2011 |

* cited by examiner

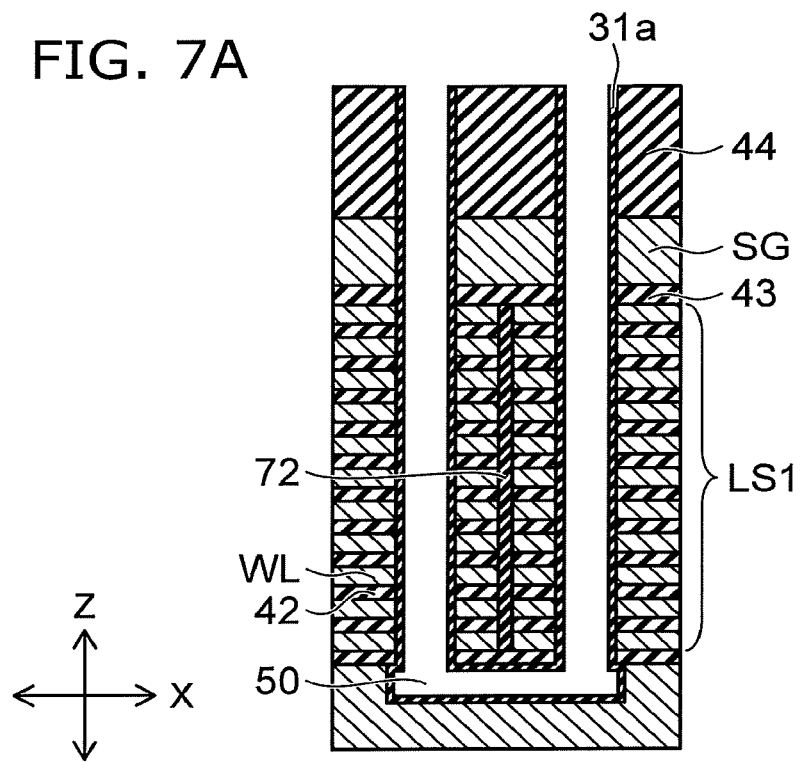
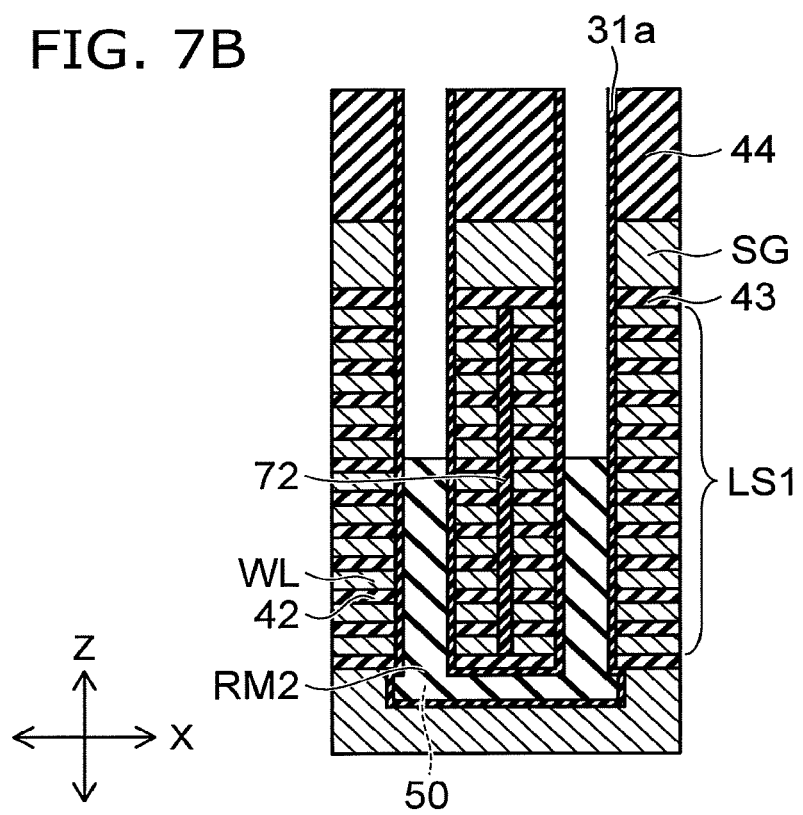

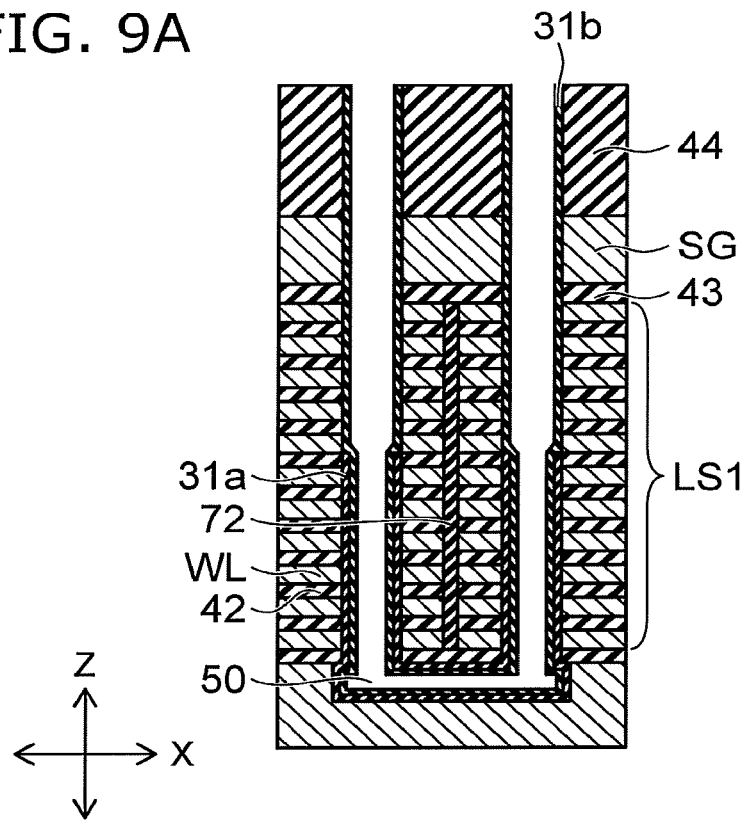
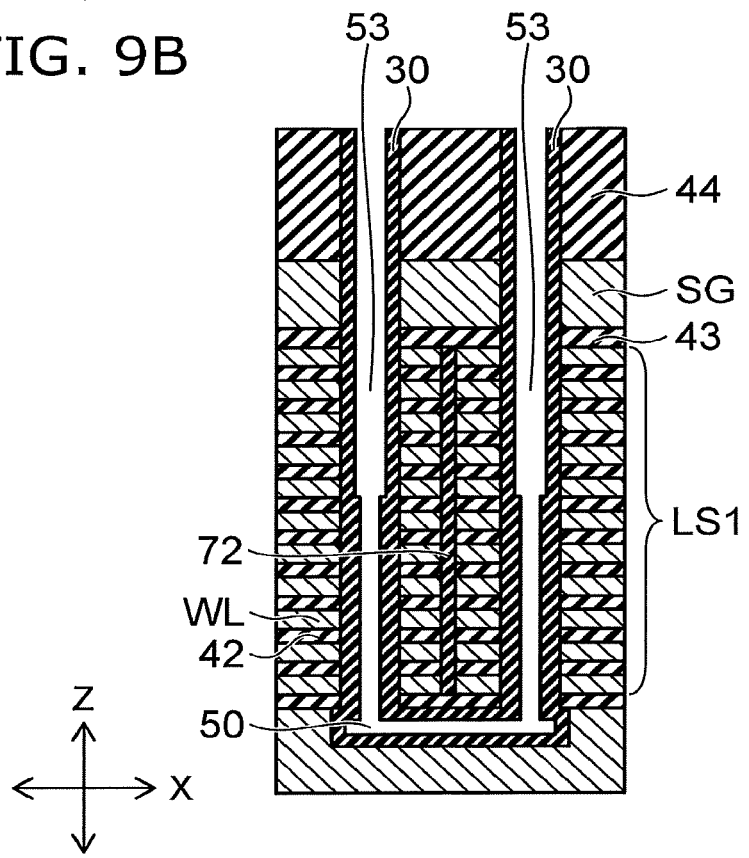

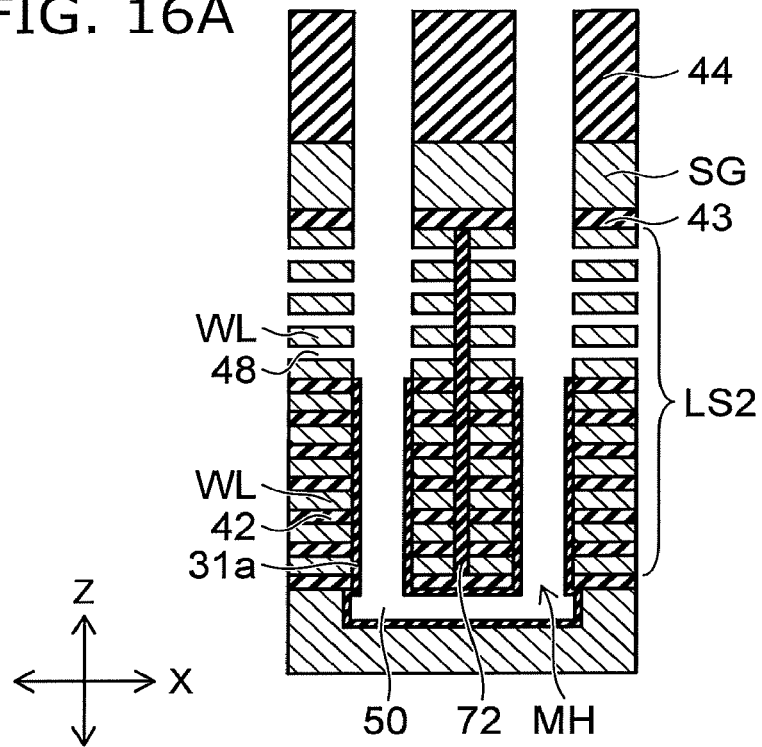
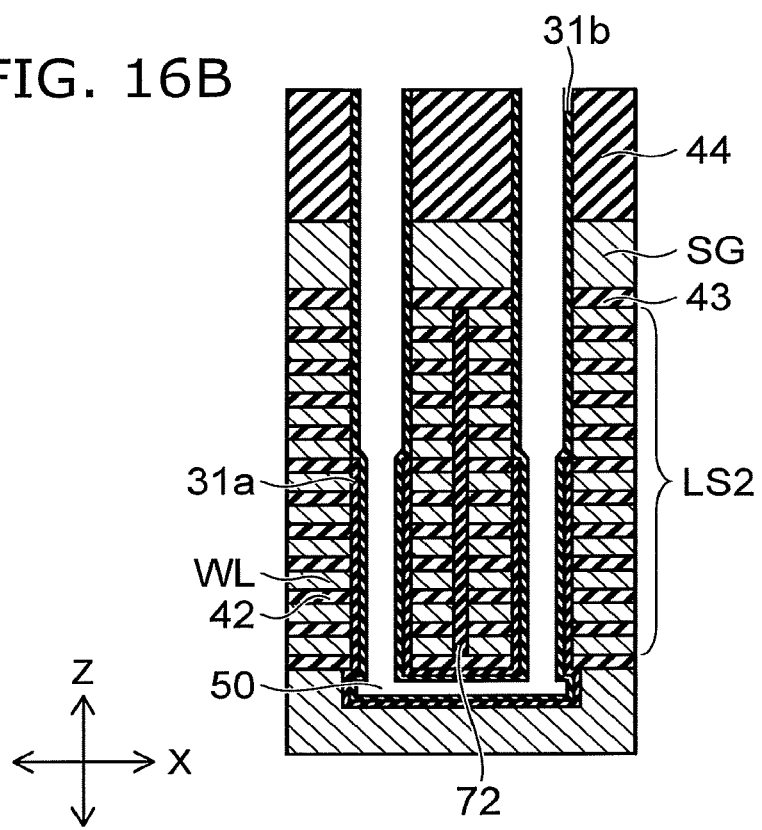

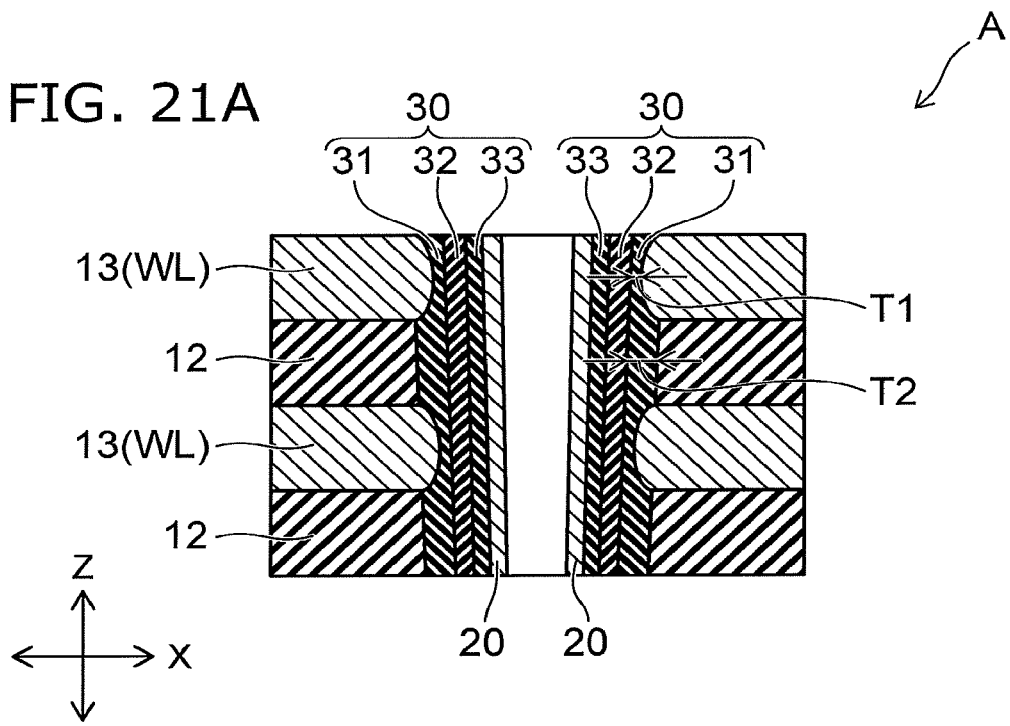
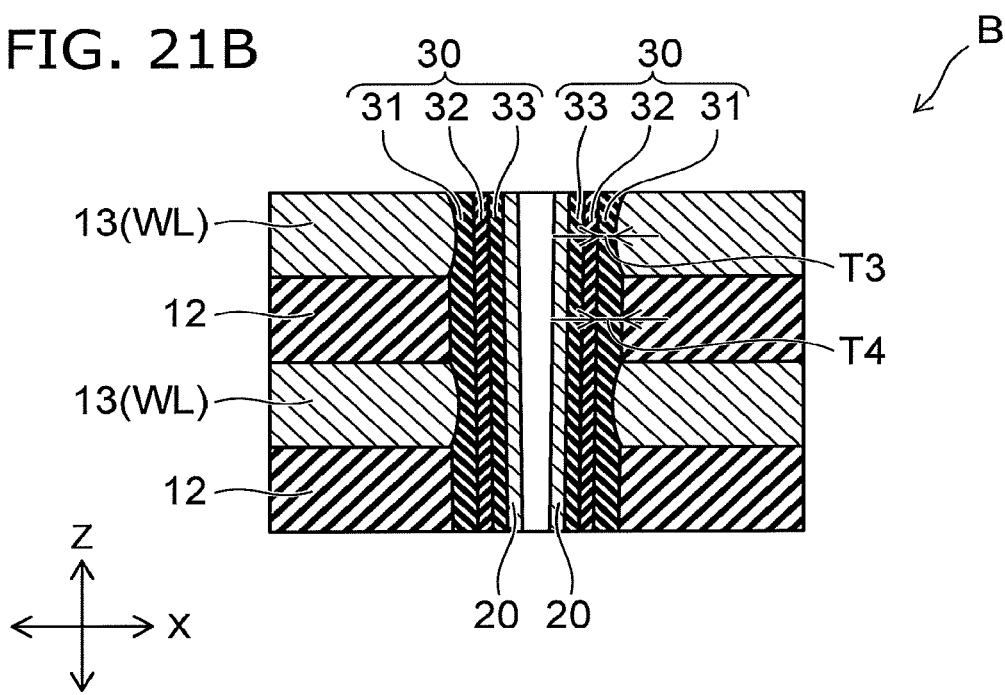

SEMICONDUCTOR DEVICE INCLUDING A BLOCKING LAYER HAVING A VARYING THICKNESS

CROSS-REFERENCE TO RELATED APPLICATION

This is a continuation application of International Application PCT/JP2016/086725, filed on Dec. 9, 2016. This application also claims priority to Japanese Application No. 2015-240394, filed on Dec. 9, 2015. The entire contents of each are incorporated herein by reference.

FIELD

Embodiments described herein relate generally to a semiconductor device and a method for manufacturing the same.

BACKGROUND

In recent years, a semiconductor device has been proposed in which memory cells are integrated three-dimensionally. In such a semiconductor device, a through-hole is formed in a stacked body in which insulating layers and conductive layers are stacked alternately; and the memory cells are formed between a silicon layer and the conductive layers by forming a memory layer and the silicon layer on the inner surface of the through-hole, wherein the memory layer is capable of storing charge.

BRIEF DESCRIPTION OF THE DRAWINGS

FIG. 4A to FIG. 11 are process cross-sectional views illustrating the example of the method for manufacturing the semiconductor device according to the embodiment;

FIG. 12A to FIG. 17 are process cross-sectional views illustrating the other example of the method for manufacturing the semiconductor device according to the embodiment;

FIGS. 21A and 21B are cross-sectional views in which portions of FIG. 20 are enlarged;

DETAILED DESCRIPTION

Figure 1:
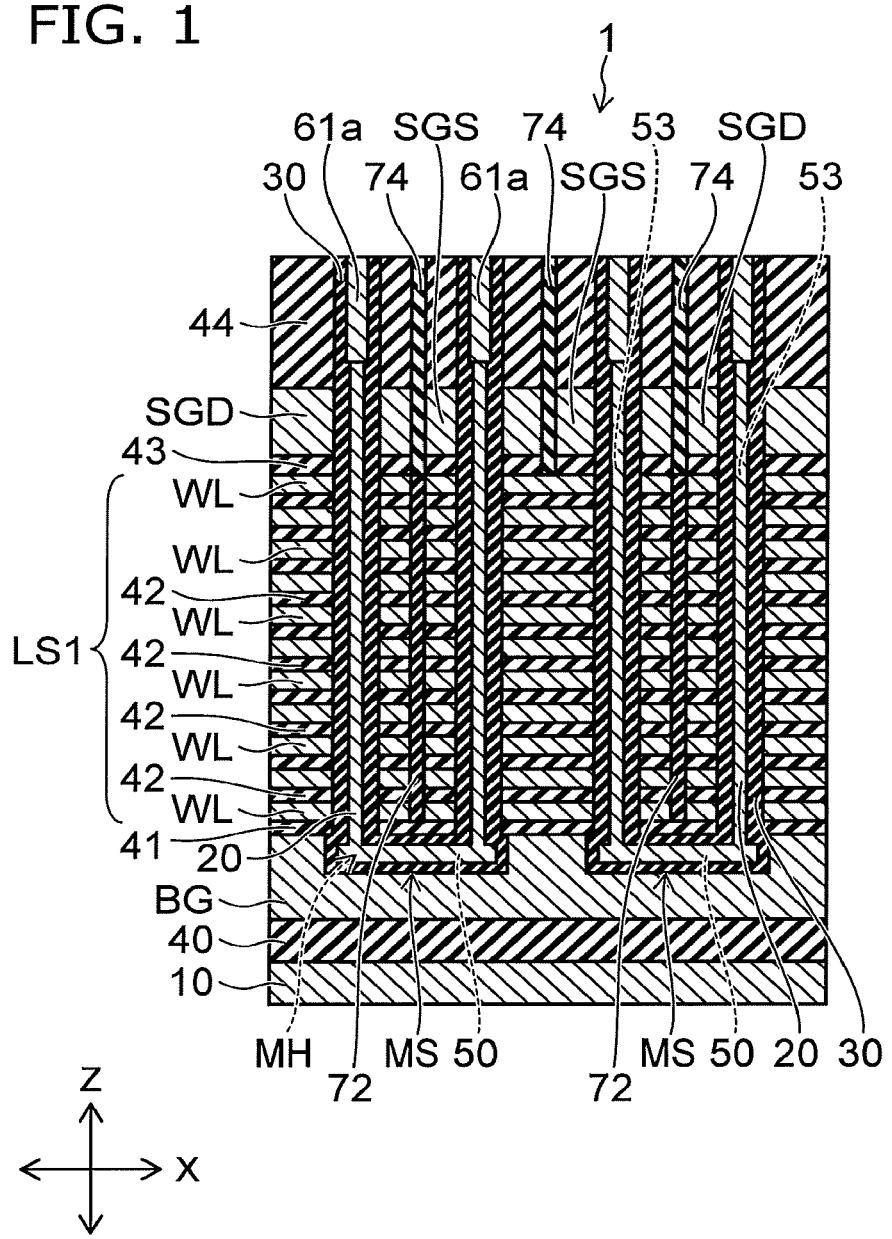
FIG. 1 is a cross-sectional view of the semiconductor device according to an example of the embodiment.

According to one embodiment, a semiconductor device includes a substrate, a stacked body, and a columnar portion. The stacked body includes a plurality of first conductive layers and a plurality of first insulating layers. The stacked body is provided on the substrate. The first conductive layers and the first insulating layers are provided alternately along a first direction. The columnar portion extends through the stacked body in the first direction. The columnar portion includes a blocking layer, a charge storage layer, a tunneling layer, and a semiconductor layer. The blocking layer is provided on the plurality of first conductive layers and on the plurality of first insulating layers in a second direction crossing the first direction. The charge storage layer is provided on the blocking layer in the second direction. The tunneling layer is provided on the charge storage layer in the second direction. The semiconductor layer is provided on the tunneling layer in the second direction. The columnar portion includes a first portion and a second portion. The second portion is provided on the substrate side of the first portion. A dimension in the second direction of the second portion is smaller than a dimension in the second direction of the first portion. A portion of the blocking layer is provided at the second portion being thicker than a portion of the blocking layer provided at the first portion.

In the drawings and the specification of the application, components similar to those described thereinabove are marked with like reference numerals, and a detailed description is omitted as appropriate.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

Embodiments of the invention will now be described with reference to the drawings.

An XYZ orthogonal coordinate system is used in the description of the embodiments. Two directions that are parallel to the main surface of the substrate and are orthogonal to each other are defined as the X direction and the Y direction, and the direction orthogonal to both the X direction and the Y direction is defined as the Z direction.

First, a semiconductor device 1 according to an embodiment will be described using FIG. 1 to FIG. 3B.

The semiconductor device 1 is, for example, a nonvolatile semiconductor memory device that can electrically erase/program data and can retain the memory content even when the power supply is OFF.

FIG. 1 is a cross-sectional view of the semiconductor device 1 according to an example of the embodiment.

Figure 2:
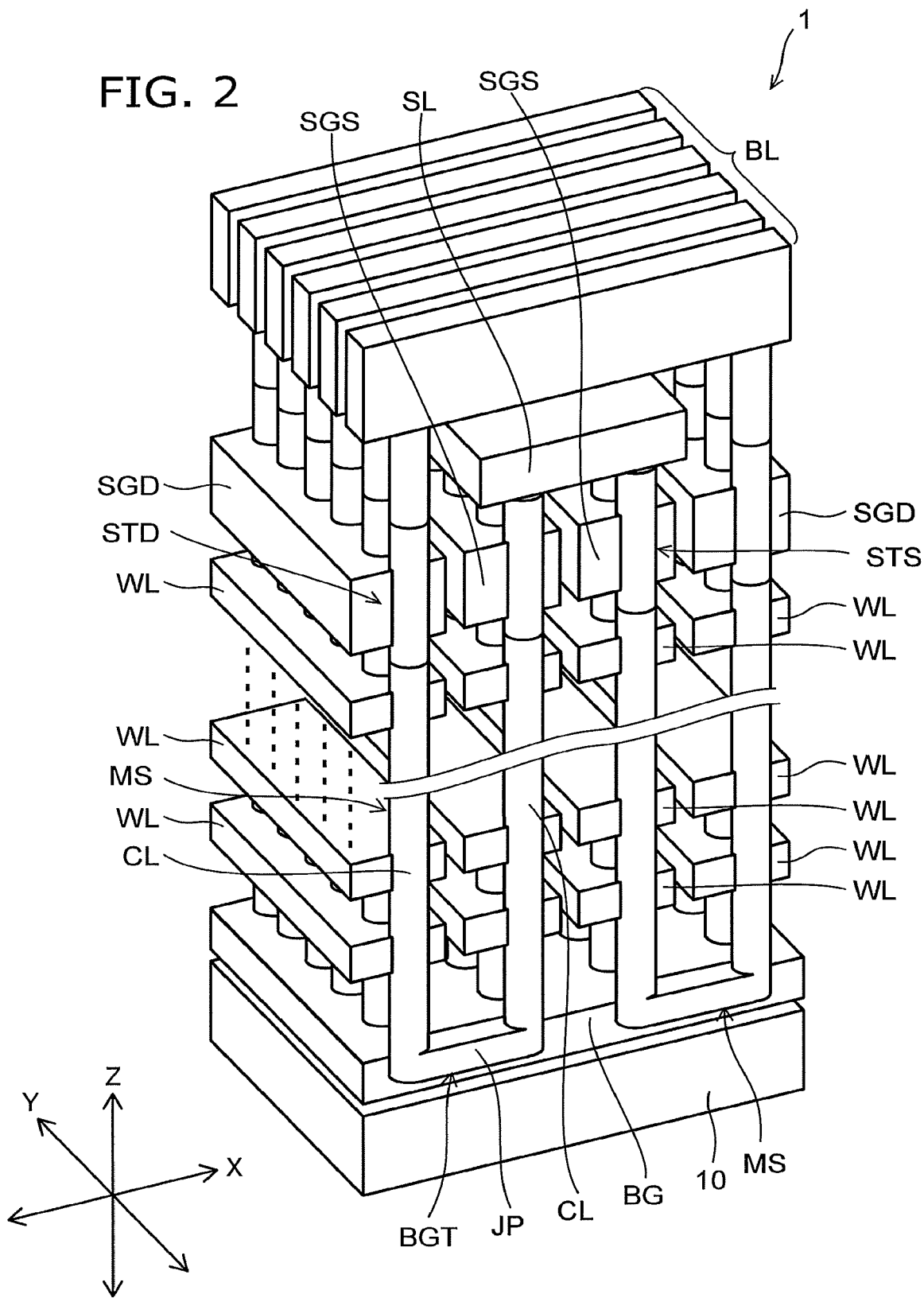
FIG. 2 is a perspective view of the semiconductor device according to the example of the embodiment.

FIG. 2 is a perspective view of the semiconductor device 1 according to the example of the embodiment.

Figure 3A:
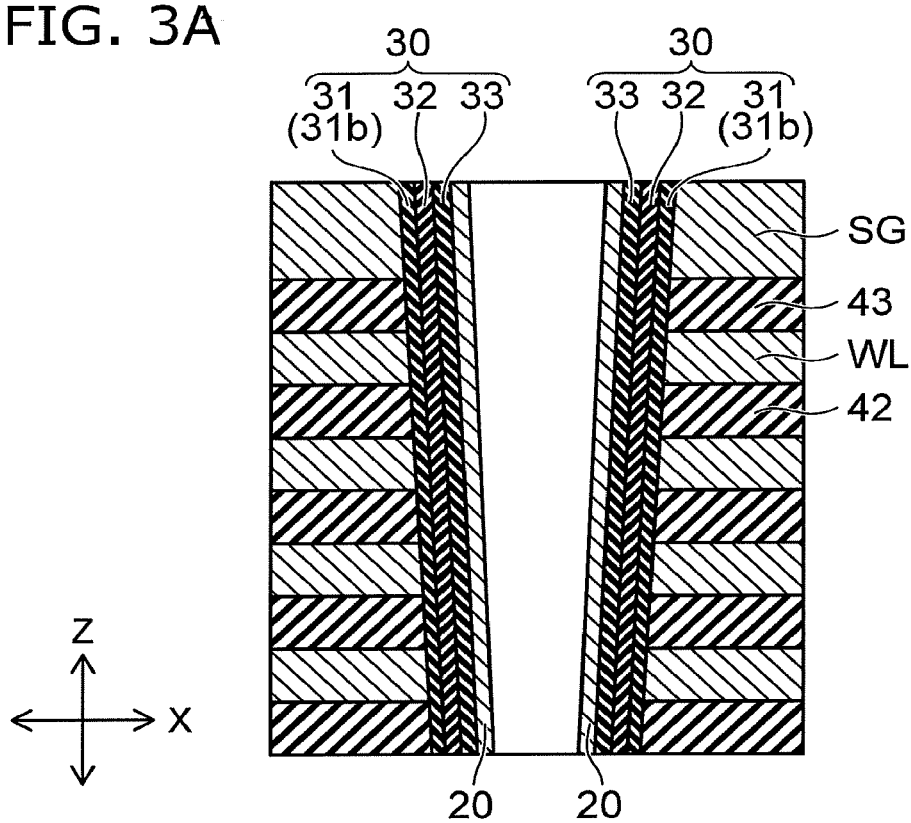
FIGS. 3A and 3B are partially enlarged cross-sectional views of the semiconductor device according to the example of the embodiment.
Figure 3B:
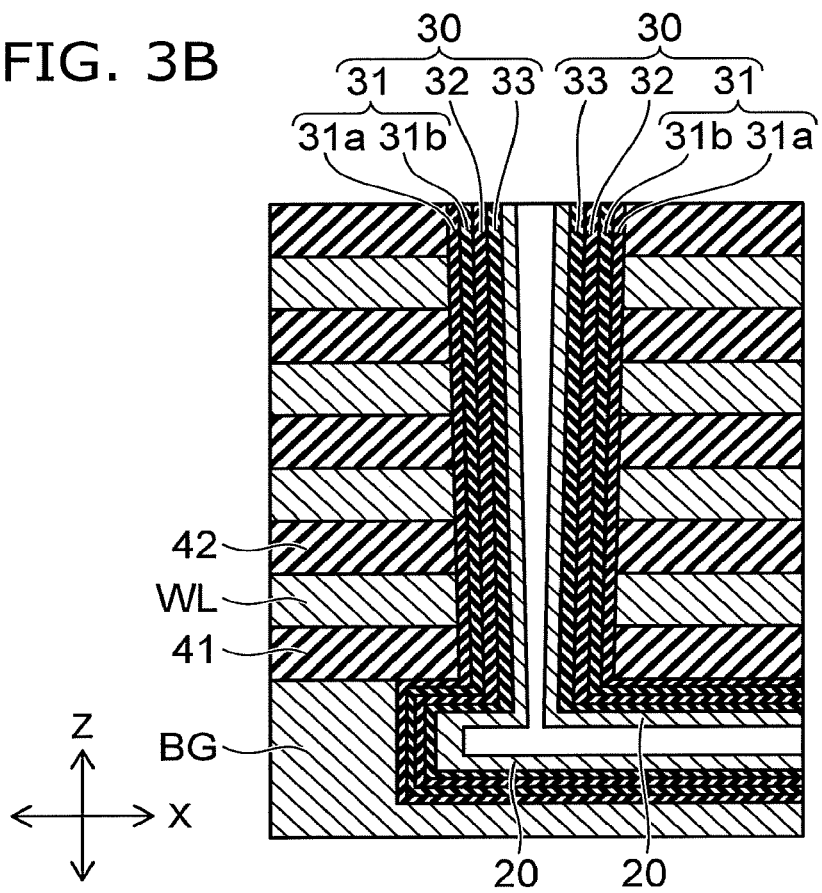

FIGS. 3A and 3B are partially enlarged cross-sectional views of the semiconductor device 1 according to the example of the embodiment.

In FIG. 2, the insulating portions are not illustrated for easier viewing of the drawing.

As illustrated in FIG. 1, an insulating layer 40 is provided on a substrate 10.

A back gate BG is provided on the insulating layer 40.

The back gate BG is a conductive layer and is, for example, a silicon layer to which an impurity is added.

An insulating layer 41 is provided on the back gate BG.

A stacked body LS1 in which conductive layers WL and insulating layers 42 are multiply stacked alternately is provided on the insulating layer 41. The stacked body LS1 is divided into a plurality by an insulating portion 72.

An insulating layer 43 is provided on the stacked body LS1 including the conductive layers WL and the insulating layers 42.

The number of layers of the conductive layers WL shown in FIG. 1 is an example; and the number of layers of the conductive layers WL is arbitrary.

The conductive layer WL is a polycrystalline silicon layer (a first silicon layer) to which, for example, boron is added as an impurity; and the conductive layer WL has sufficient conductivity to function as a gate electrode of the memory cell.

The insulating layers 41, 42, and 43 are, for example, layers including mainly silicon oxide. Or, these insulating layers may be layers including mainly silicon nitride.

As illustrated in FIG. 2, the semiconductor device 1 includes multiple memory strings MS.

One memory string MS includes two columnar portions CL, and a linking portion JP linking the lower ends of the two columnar portions CL.

The columnar portion CL extends in the stacking direction of the multiple conductive layers WL and the multiple insulating layers 42 (a Z-direction) to pierce the multiple conductive layers WL, the multiple insulating layers 42, the insulating layer 41, and the insulating layer 43.

The columnar portion CL is, for example, a circle when viewed from the Z-direction.

The linking portion JP is provided to be positioned between the back gate BG and the columnar portion CL. More specifically, a portion of the linking portion JP is provided between the columnar portion CL and a portion of the back gate BG. Another portion of the linking portion JP is provided between another columnar portion CL and a portion of the back gate BG. Yet another portion of the linking portion JP is provided between a portion of the back gate BG and a portion of the insulating layer 41.

The memory string MS may include only the columnar portion CL and may have an I-shaped configuration. In such a case, the columnar portion CL can be provided so that the lower end of the columnar portion CL is positioned inside the back gate BG.

In the case where the memory string MS includes only the columnar portion CL and has an I-shaped configuration, the semiconductor device may be configured so that the columnar portion CL is electrically connected to the substrate 10.

As illustrated in FIG. 1, a select gate layer that is a conductive layer is provided on the insulating layer 43. The select gate layer includes a drain-side select gate SGD and a source-side select gate SGS.

The upper end portion of one columnar portion CL of the two columnar portions CL of the memory string MS is connected to the drain-side select gate SGD. The upper end portion of the other columnar portion CL is connected to the source-side select gate SGS.

The select gate layer is a polycrystalline silicon layer to which, for example, boron is added as an impurity; and the select gate layer has sufficient conductivity to function as a gate electrode of a select transistor. For example, the thickness of the select gate layer is thicker than the thickness of each of the conductive layers WL.

The drain-side select gate SGD and the source-side select gate SGS are separated in an X-direction by an insulating layer 74.

An insulating layer 44 is provided on the source-side select gate SGS. A source line SL illustrated in FIG. 2 is provided on the insulating layer 44. For example, the source line SL is a metal layer.

The source line SL is electrically connected to the upper end of the columnar portion CL among the two columnar portions CL of the memory string MS to which the source-side select gate SGS is connected.

Multiple bit lines BL are provided, with a not-illustrated insulating layer interposed, on the drain-side select gate SGD and the source line SL. The bit lines BL are, for example, metal layers.

The bit line BL is electrically connected to the upper end of the columnar portion CL among the two columnar portions CL of the memory string MS to which the drain-side select gate SGD is connected.

The memory string MS includes a channel body 20.

The channel body 20 is provided inside a memory hole MH. The memory hole MH has a U-shaped configuration and is formed in a stacked structure including the back gate BG, the multiple conductive layers WL, the insulating layers 41 to 44, the drain-side select gate SGD, and the source-side select gate SGS.

The channel body 20 includes, for example, a semiconductor layer made of a non-doped silicon layer. Here, non-doped indicates that an impurity providing conductivity to the silicon layer is not added intentionally; and impurities other than elements caused by the source gases in the film formation substantially are not included.

A memory layer 30 is provided between the channel body 20 and the inner wall of the memory hole MH. In other words, the channel body 20 is provided inside the memory hole MH with the memory layer 30 interposed.

Here, the detailed structure of the memory string MS will be described using FIGS. 3A and 3B.

FIG. 3A is an enlarged cross-sectional view illustrating the upper portion of the columnar portion CL. FIG. 3B is an enlarged cross-sectional view illustrating the lower portion of the columnar portion CL and a portion of the linking portion JP.

In the specification, the lower portion (a second portion) of the columnar portion CL means the portion provided on the substrate 10 side of the upper portion (a first portion) of the columnar portion CL.

The columnar portion CL includes a portion of the memory layer 30 and a portion of the channel body 20.

Similarly, the linking portion JP also includes a portion of the memory layer 30 and a portion of the channel body 20.

The memory layer 30 includes a blocking layer 31, a charge storage layer 32, and a tunneling layer 33.

The blocking layer 31 is provided on the multiple conductive layers WL, on the insulating layer 41, on the insulating layers 42, and on the insulating layer 43 in a direction crossing the Z-direction. In other words, the blocking layer 31 is provided on the side surfaces of the multiple conductive layers WL, on the side surfaces of the multiple insulating layers 42, on the side surface of the insulating layer 41, and on the side surface of the insulating layer 43.

The blocking layer 31 includes a first blocking layer 31a, or includes the first blocking layer 31a and a second blocking layer 31b.

In the linking portion JP, a portion of the blocking layer 31 is provided on the back gate BG; and another portion of the blocking layer 31 is provided on the lower surface of the insulating layer 41.

The charge storage layer 32 is provided on the blocking layer 31 at the columnar portion CL and the linking portion JP.

The tunneling layer 33 is provided on the charge storage layer 32 at the columnar portion CL and the linking portion JP.

The channel body 20 is provided on the tunneling layer 33 at the columnar portion CL and the linking portion JP.

In other words, the charge storage layer 32 is provided between the blocking layer 31 and the tunneling layer 33; and the tunneling layer 33 is provided between the charge storage layer 32 and the channel body 20.

In the example illustrated in FIGS. 3A and 3B, a hollow portion is formed inside the channel body 20 (on the central axis side of the memory hole MH).

However, the entire interior of the memory layer 30 may be filled with the channel body 20. Or, a structure may be used in which the hollow portion that is inside the channel body 20 is filled with an insulator.

The columnar portion CL includes memory cells as a nonvolatile semiconductor memory device. The memory cells are, for example, charge trap memory cells.

The channel body 20 functions as a region where a channel is formed.

The conductive layers WL function as control gates of the memory cells.

The charge storage layer 32 functions as a data storage layer that stores charge injected from the channel body 20.

In other words, the memory cells are formed to have a structure in which the control gates surround the periphery of the channel at the crossing portions between the channel body 20 and the conductive layers WL.

The blocking layer 31 is an insulating layer and prevents the charge stored in the charge storage layer 32 from diffusing into the conductive layers WL. The first blocking layer 31a and the second blocking layer 31b that are included in the blocking layer 31 are, for example, silicon oxide layers.

The first blocking layer 31a and the second blocking layer 31b may be layers including a material having a dielectric constant that is higher than that of silicon oxide. For example, silicon nitride can be used as the high dielectric constant material.

The insulating material that is included in the first blocking layer 31a may be different from the insulating material included in the second blocking layer 31b.

However, to suppress the fluctuation of characteristics between the characteristics of the memory cells in the upper portion of the columnar portion CL and the characteristics of the memory cells in the lower portion of the columnar portion CL, it is desirable for the insulating material included in the first blocking layer 31a to be the same as the insulating material included in the second blocking layer 31b.

The charge storage layer 32 has many trap sites that trap the charge. The charge storage layer 32 is, for example, a silicon nitride layer.

The tunneling layer 33 is an insulating layer. The tunneling layer 33 functions as a potential barrier when the charge from the channel body 20 is injected into the charge storage layer 32 or when the charge stored in the charge storage layer 32 is diffused into the channel body 20. The tunneling layer 33 is, for example, a silicon oxide layer.

As illustrated in FIG. 3B, the blocking layer 31 includes the first blocking layer 31a and the second blocking layer 31b at the linking portion JP and the lower portion of the columnar portion CL.

Conversely, as illustrated in FIG. 3A, the blocking layer 31 at the upper portion of the columnar portion CL includes only the second blocking layer 31b.

Accordingly, the thickness of the portion of the blocking layer 31 provided at the lower portion of the columnar portion CL is thicker than the thickness of the portion of the blocking layer 31 provided at the upper portion of the columnar portion CL. in other words, the thickness in the direction from the charge storage layer 32 toward the stacked body LS1 of the portion of the blocking layer 31 provided at the lower portion of the columnar portion CL is thicker than the thickness in the direction from the charge storage layer 32 toward the stacked body LS1 of the portion of the blocking layer 31 provided at the upper portion of the columnar portion CL.

The thickness of the portion of the blocking layer 31 provided on the insulating layer 41 is thicker than the thickness of the portion of the blocking layer 31 provided on the insulating layer 43. In other words, the thickness in the direction from the charge storage layer 32 toward the stacked body LS1 of the portion of the blocking layer 31 provided on the insulating layer 41 is thicker than the thickness in the direction from the charge storage layer 32 toward the stacked body LS1 of the portion of the blocking layer 31 provided on the insulating layer 43.

The thickness of the portion of the blocking layer 31 included in the linking portion JP is thicker than the thickness of the portion of the blocking layer 31 provided at the upper portion of the columnar portion CL. In other words, the thickness in the direction from the charge storage layer 32 toward the back gate BG of the portion of the blocking layer 31 included in the linking portion JP is thicker than the thickness in the direction from the charge storage layer 32 toward the stacked body LS1 of the portion of the blocking layer 31 provided at the upper portion of the columnar portion CL.

The inner wall of the memory hole MH is tilted with respect to the Z-direction. Therefore, the dimension in the X-direction of the lower portion of the columnar portion CL is smaller than the dimension in the X-direction of the upper portion of the columnar portion CL.

Similarly in the embodiment, the dimension in a Y-direction of the lower portion of the columnar portion CL is smaller than the dimension in the Y-direction of the upper portion of the columnar portion CL.

As illustrated in FIG. 2, the drain-side select gate SGD, a portion of the channel body 20, and a portion of the memory layer 30 are included in a drain-side select transistor STD. The channel body 20 is connected to the bit line BL via a conductor 61a above the drain-side select gate SGD. The conductor 61a is, for example, a silicon layer doped with phosphorus (P).

The source-side select gate SGS, a portion of the channel body 20, and a portion of the memory layer 30 are included in a source-side select transistor STS. The channel body 20 is connected to the source line SL via the conductor 61a above the source-side select gate SGS.

The back gate BG, the portion of the channel body 20 provided inside the back gate BG, and the portion of the memory layer 30 provided inside the back gate BG are included in a back gate transistor BGT.

The memory cells that have the conductive layers WL as control gates are multiply provided between the drain-side select transistor STD and the back gate transistor BGT. Similarly, the memory cells that have the conductive layers WL as control gates are multiply provided also between the back gate transistor BGT and the source-side select transistor STS.

The multiple memory cells, the drain-side select transistor STD, the back gate transistor BGT, and the source-side select transistor STS are connected in series via the channel body 20 and are included in one memory string MS. By multiply arranging the memory strings MS in the X-direction and the Y-direction, the multiple memory cells are provided three-dimensionally in the X-direction, the Y-direction, and the Z-direction.

Example of Manufacturing Method

An example of the method for manufacturing the semiconductor device according to the embodiment will now be described with reference to FIG. 4A to FIG. 11.

FIG. 4A to FIG. 11 are process cross-sectional views illustrating the example of the method for manufacturing the semiconductor device according to the embodiment. FIG. 4A to FIG. 11 illustrate cross sections along the X-direction similar to FIG. 1.

First, the insulating layer 40 and the back gate BG are formed on the substrate 10. The insulating layer 40 is silicon oxide. The back gate BG is, for example, a polycrystalline silicon layer to which boron (B) is added.

Figure 4A:
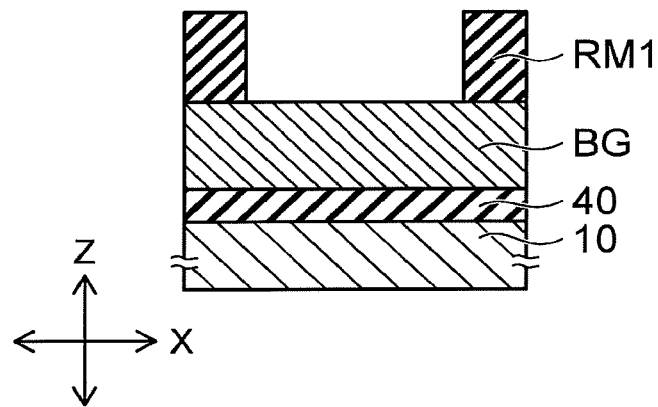

Continuing as illustrated in FIG. 4A, a resist mask RM1 is formed using photolithography on the back gate BG.

Figure 4B:
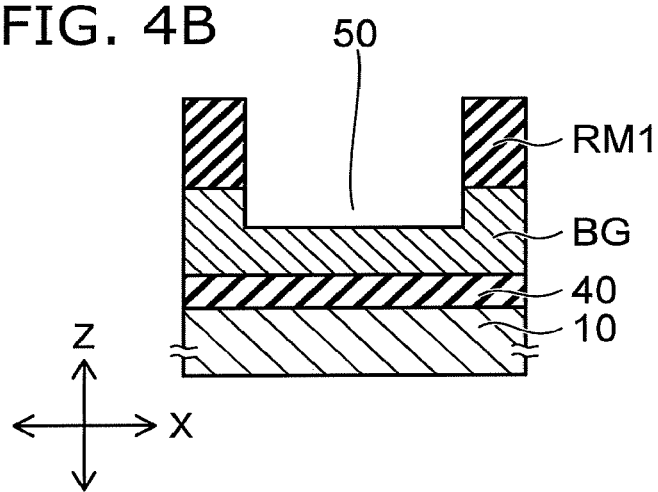

Then, as illustrated in FIG. 4B, a trench 50 is formed in the back gate BG. The trench 50 is formed by patterning the back gate BG using the resist mask RM1.

Figure 4C:
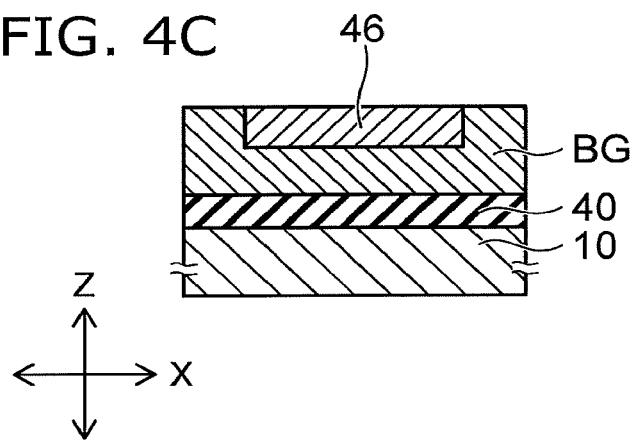

Continuing as illustrated in FIG. 4C, a sacrificial layer 46 is filled into the trench 50. The sacrificial layer 46 is, for example, a non-doped silicon layer.

Then, the insulating layer 41 is formed on the back gate BG and on the sacrificial layer 46.

Continuing, the conductive layers WL and the insulating layers 42 are stacked alternately on the insulating layer 41. By this process, the stacked body LS1 is formed on the insulating layer 41.

Figure 5A:
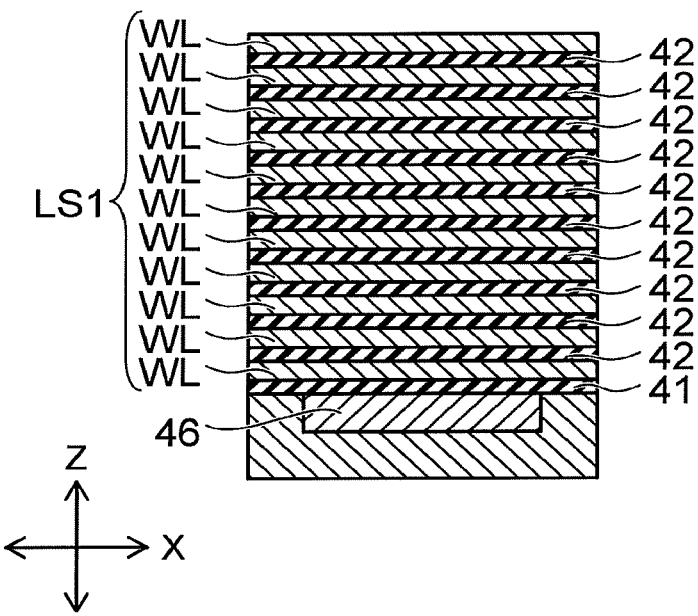

The state at this time is illustrated in FIG. 5A.

The substrate 10 and the insulating layer 40 are not illustrated in FIG. 5A to FIG. 11.

The insulating layer 40, the back gate BG, the insulating layer 41, the conductive layers WL, and the insulating layers 42 are formed by, for example, CVD (Chemical Vapor Deposition).

The conductive layers WL are, for example, polycrystalline silicon layers to which boron (B) is added as an impurity.

The insulating layers 42 are, for example, silicon oxide layers.

Then, a trench is formed in the stacked body made of the multiple conductive layers WL and the multiple insulating layers 42. Continuing, the insulating portion 72 is formed by depositing an insulating material in the interior of the trench. Continuing, the insulating layer 43 is formed on the conductive layer WL of the uppermost layer.

Then, the select gate SG is formed on the insulating layer 43. Ultimately, a portion of the select gate SG is used as the drain-side select gate SGD; and another portion of the select gate SG is used as the source-side select gate SGS.

Continuing, the insulating layer 44 is formed on the select gate SG.

Figure 5B:
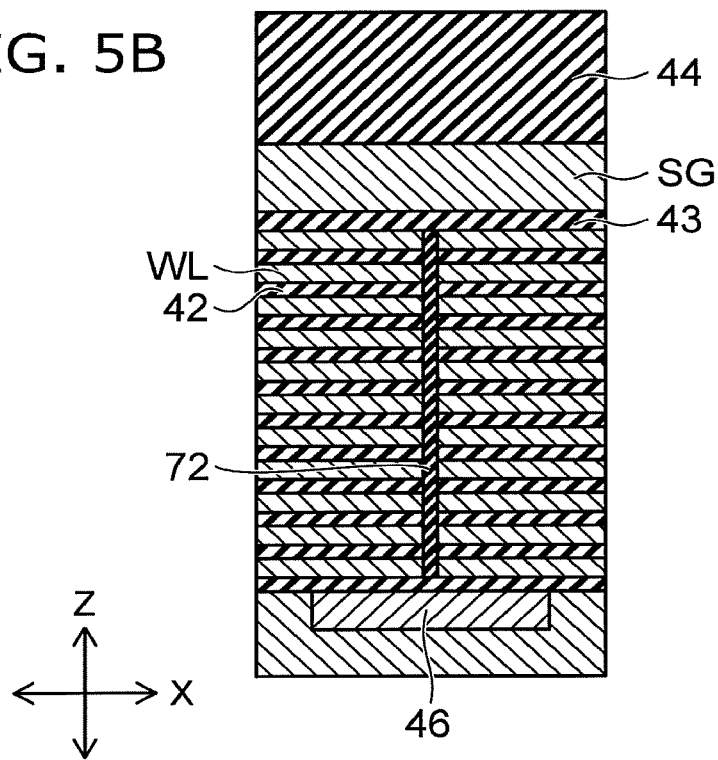

The state at this time is illustrated in FIG. 5B.

Figure 6A:
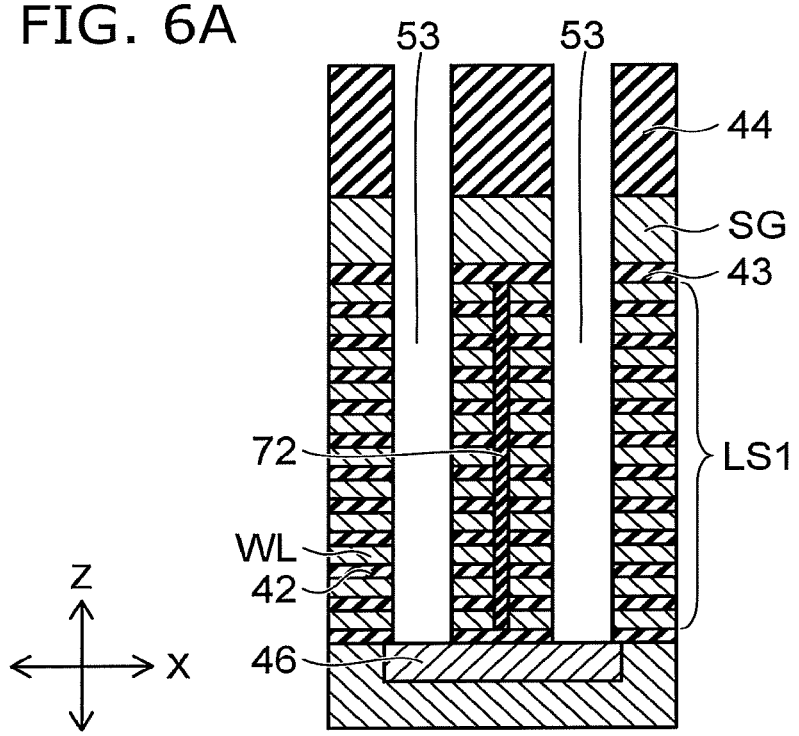

Then, as illustrated in FIG. 6A, multiple openings 53 are formed in the stacked structure obtained in the processes recited above. By this process, holes that pierce the stacked body LS1 are formed. The openings 53 are formed by, for example, RIE (Reactive Ion Etching) using a not-illustrated mask.

At this time, the bottom portions of the openings 53 reach the sacrificial layer 46. In other words, the sacrificial layer 46 is exposed via the openings 53. At this time, two openings 53 are formed on one sacrificial layer 46.

Also, the side surfaces of the conductive layers WL and the side surfaces of the insulating layers 42 are exposed by the formation of the openings 53.

The opening 53 is formed in a tapered configuration; and the dimensions in the X-direction and the Y-direction at the lower portion are smaller than the dimensions in the X-direction and the Y-direction at the upper portion.

Therefore, the dimensions in the X-direction and the Y-direction of the opening formed in the conductive layers WL positioned at the upper portion of the stacked body LS1 are larger than the dimensions in the X-direction and the Y-direction of the opening formed in the conductive layers WL positioned at the lower portion of the stacked body LS1.

After forming the openings 53, the sacrificial layer 46 is removed by, for example, wet etching. For example, an alkaline chemical liquid such as a KOH (potassium hydroxide) solution, etc., can be used as the etchant.

The etching rate of a silicon layer for the alkaline chemical liquid is dependent on the concentration of the impurity doped inside the silicon layer. For example, when the concentration of boron as the impurity becomes $1 \times 10^{20}$ ($cm^{-3}$) or more, the etching rate decreases abruptly and becomes less, by a factor of several tens, than that when the boron concentration is $1 \times 10^{19}$ ($cm^{-3}$) or less.

According to the embodiment, the boron concentrations in the back gate BG, the conductive layers WL, and the select gate SG are $1 \times 10^{21}$ ($cm^{-3}$) to $2 \times 10^{21}$ ($cm^{-3}$). In wet etching using an alkaline chemical liquid, the etching selectivity of a non-doped silicon layer is 1/1000 to 1/100 of a silicon layer having a boron concentration of $1 \times 10^{21}$ ($cm^{-3}$) to $2 \times 10^{21}$ ($cm^{-3}$).

Figure 6B:
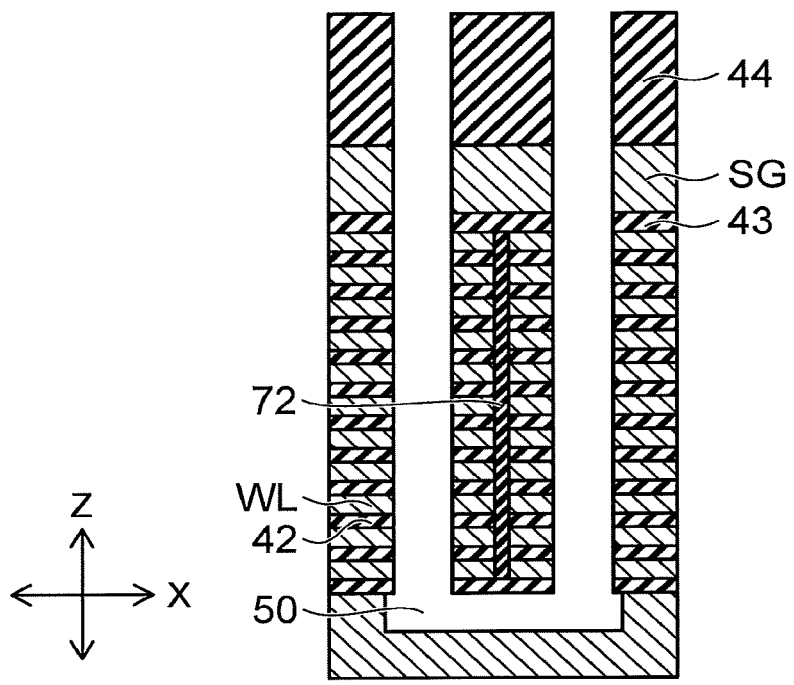

Accordingly, the sacrificial layer 46 which is a non-doped silicon layer is selectively removed by the wet etching via the openings 53 as illustrated in FIG. 6B.

By the removal of the sacrificial layer 46, the trench 50 that was formed in the back gate BG in a previous process reappears. By this process, two openings 53 that are formed on one sacrificial layer 46 communicate with one common trench 50; and one memory hole MH having a U-shaped configuration is formed.

Then, as illustrated in FIG. 7A, the first blocking layer 31a is formed on the inner wall of the memory hole MH, that is, on the side surfaces of the conductive layers WL, on the side surfaces of the insulating layers 42, and on the inner wall of the trench 50. The first blocking layer 31a is, for example, silicon oxide. Here, for example, the first blocking layer 31a can be formed by atomic layer deposition (ALD) or chemical vapor deposition (CVD).

Then, a photoresist is filled into the memory hole MH in which the first blocking layer 31a is formed. Subsequently, the upper portion of the photoresist inside the memory hole MH is removed; and a resist mask RM2 that is provided in only the lower portion inside the memory hole MH such as that illustrated in FIG. 7B is formed.

The removal of the upper portion of the photoresist is performed using, for example, oxygen plasma.

At this time, the resist mask RM2 is provided in the trench 50 interior and the lower portion inside the openings 53. In other words, the portion of the first blocking layer 31a provided at the upper portion of the stacked body LS1 including the conductive layers WL and the insulating layers 42 is not covered with the resist mask RM2 and is exposed.

The position of the upper end of the resist mask RM2 illustrated in FIG. 7B is an example. The position of the upper end of the resist mask RM2 is settable as appropriate according to the difference between the dimensions in the X-direction and the Y-direction of the upper portion of the opening provided in the stacked body LS1 and the dimensions in the X-direction and the Y-direction of the lower portion of the opening provided in the stacked body LS1. Or, the position of the upper end of the resist mask RM2 also is modifiable according to the difference between the taper angle of the upper portion and the taper angle of the lower portion in the opening of the stacked body LS1, etc.

Figure 8A:
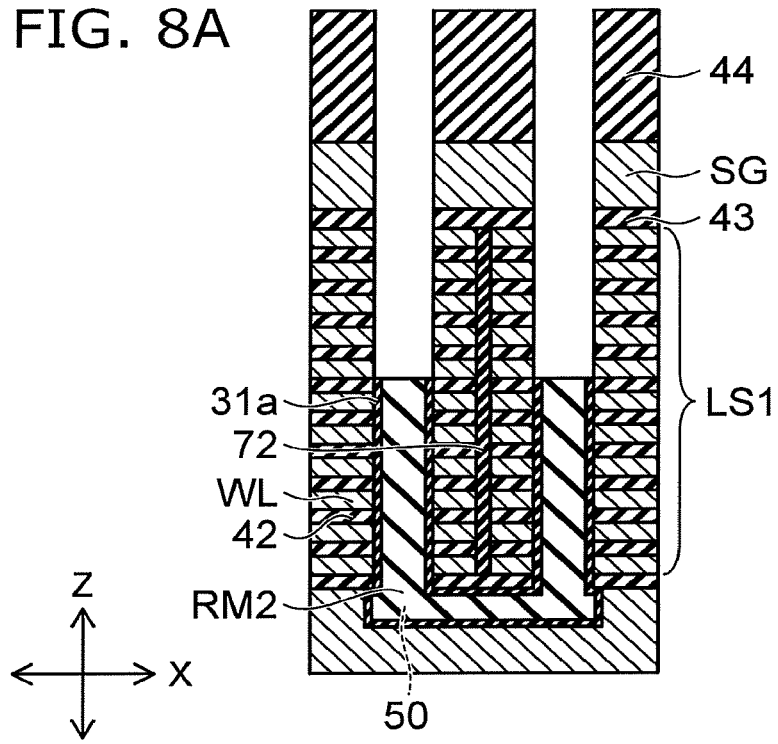

Then, as illustrated in FIG. 8A, the portion of the blocking layer 31a not covered with the resist mask RM2 is removed by, for example, CDE (Chemical Dry Etching). For example, $CF_4$ (fluorocarbon) can be used as the reactive gas used in the CDE.

By this process, the blocking layer 31a that covers only the lower portion of the stacked body LS1 including the conductive layers WL and the insulating layers 42 is formed. Also, at this time, the side surfaces of the conductive layers WL and the side surfaces of the insulating layers 42 at the upper portion of the stacked body LS1 are exposed again.

Figure 8B:
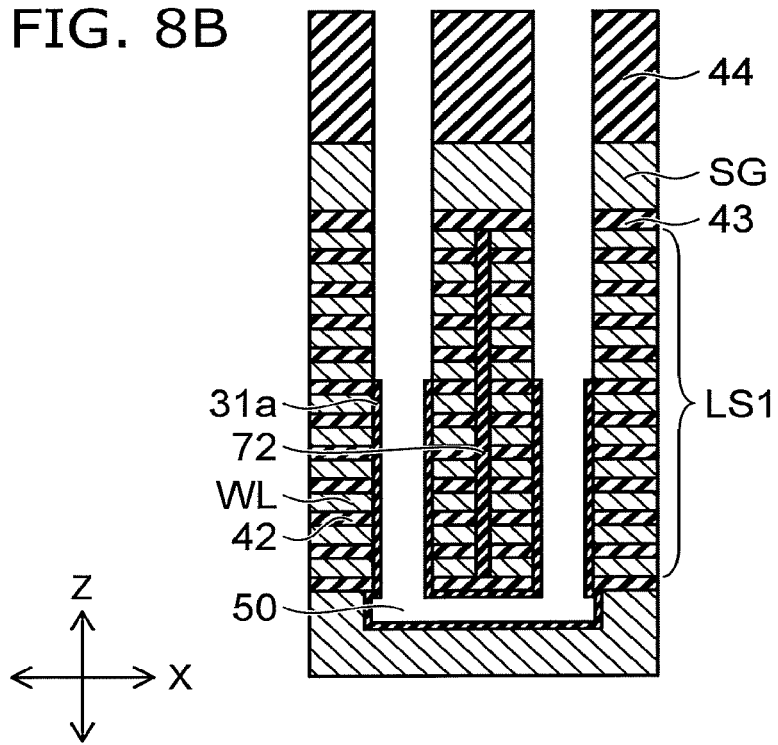

Continuing as illustrated in FIG. 8B, the resist mask RM2 is removed. The removal of the resist mask RM2 is performed using oxygen plasma.

Then, as illustrated in FIG. 9A, the second blocking layer 31b is formed inside the memory hole MH. At the lower portion of the stacked body LS1, the second blocking layer 31b is formed on the first blocking layer 31a. At the upper portion of the stacked body LS1, the second blocking layer 31b is formed on the inner wall of the opening 53, that is, on the side surfaces of the conductive layers WL exposed by removing the first blocking layer 31a. The second blocking layer 31b is, for example, silicon oxide. Here, for example, the second blocking layer 31b can be formed by ALD or CVD.

By this process, the blocking layer 31 is formed so that the thickness of the portion formed at the lower portion of the stacked body LS1 is thicker than the thickness of the portion formed at the upper portion of the stacked body LS1.

Continuing as illustrated in FIG. 9B, the memory layer 30 is formed on the memory hole MH inner wall by sequentially forming the charge storage layer 32 and the tunneling layer 33 on the second blocking layer 31b.

Figure 10A:
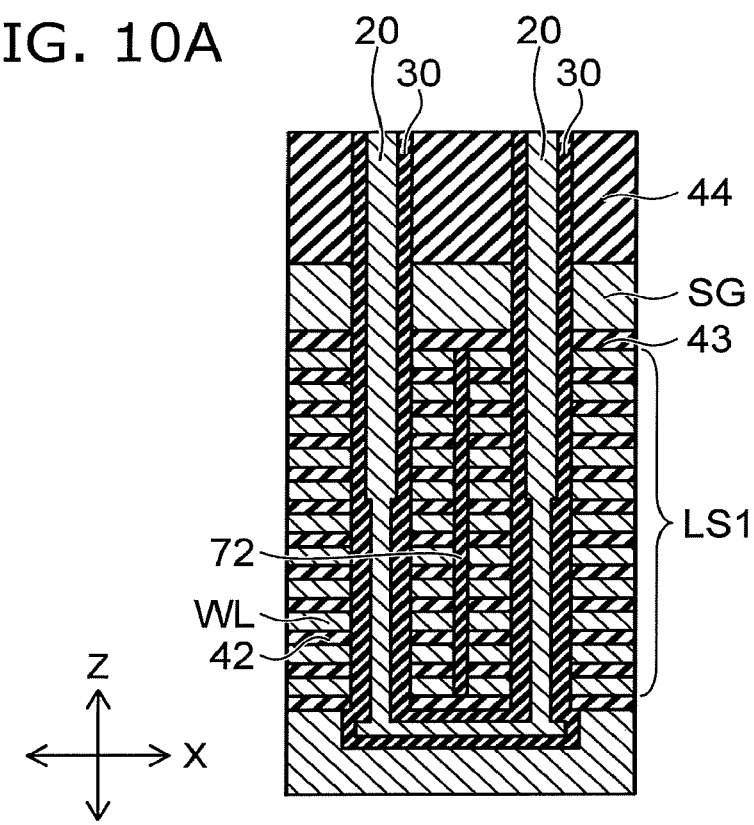

Then, as illustrated in FIG. 10A, the channel body 20 is formed inside the openings 53 and inside the trench 50 by forming a non-doped silicon layer on the inner side of the memory layer 30.

At this time, for example, as illustrated in FIGS. 3A and 3B, the interiors of the openings 53 and the interior of the trench 50 may not be filled with the channel body 20; and a gap (a void) may be formed on the hole central axis side.

Then, after forming the channel body 20, the upper portion of the channel body 20 inside the openings 53 is removed by etch-back.

Figure 10B:
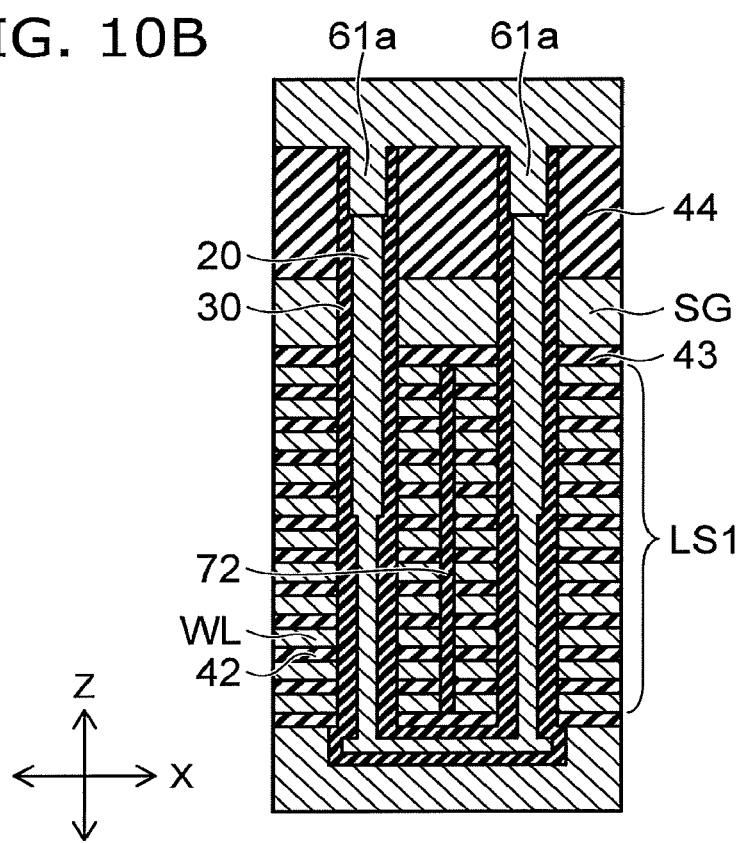

Continuing as illustrated in FIG. 10B, a polycrystalline silicon layer 61 that is doped with an impurity is formed on the channel body 20 and on the insulating layer 44. For example, the polycrystalline silicon layer 61 is doped with phosphorus (P) as an impurity.

At this time, a portion of the polycrystalline silicon layer 61 is filled as the conductor 61a at the upper portion of the channel body 20.

Figure 11:
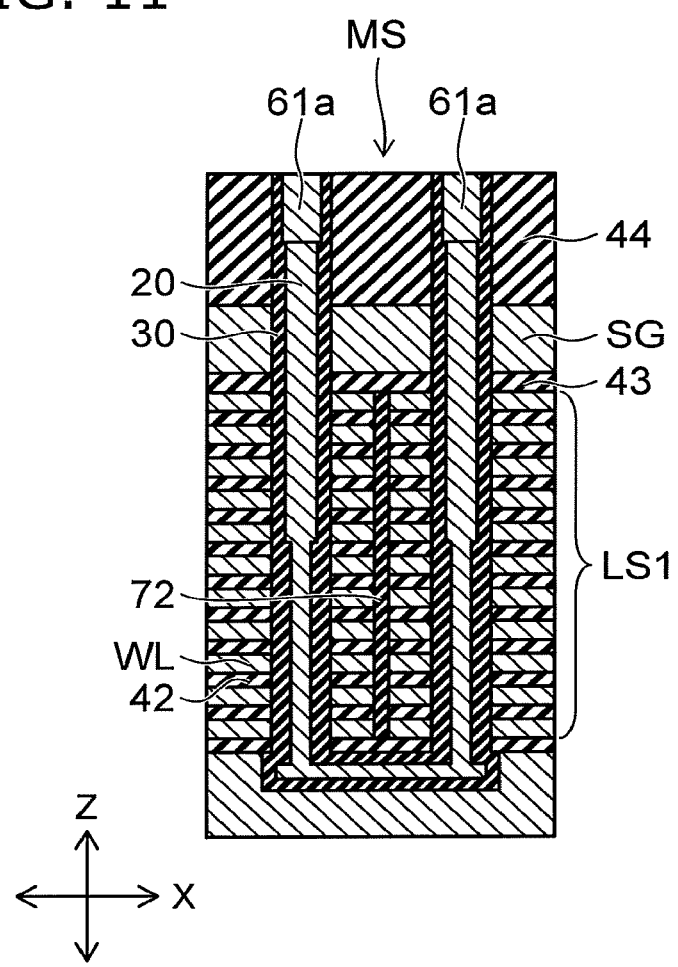

Then, as illustrated in FIG. 11, the polycrystalline silicon layer 61 that is on the insulating layer 44 is removed. At this time, the polycrystalline silicon layer 61 is removed so that the conductors 61a remain.

Subsequently, the semiconductor device 1 is obtained by forming the source line SL and the bit lines BL illustrated in FIG. 2 on the insulating layer 44.

The channel bodies 20 are connected to the bit lines BL or the source line SL via the conductors 61a and function as the channels of the memory cells.

In the example of the manufacturing method described above, the resist mask RM2 is used to remove only the upper portion of the first blocking layer 31a. However, this is not limited thereto; and only the upper portion of the first blocking layer 31a may be removed after forming the first blocking layer 31a by performing CDE without forming the resist mask RM2.

In such a case, it is possible to remove the portion of the first blocking layer 31a provided at the upper portion of the stacked body LS1 by adjusting the pressure inside the process chamber when performing the CDE, etc.

Other Example of Manufacturing Method

Another example of the method for manufacturing the semiconductor device according to the embodiment will now be described with reference to FIG. 12A to FIG. 18.

Figure 18:
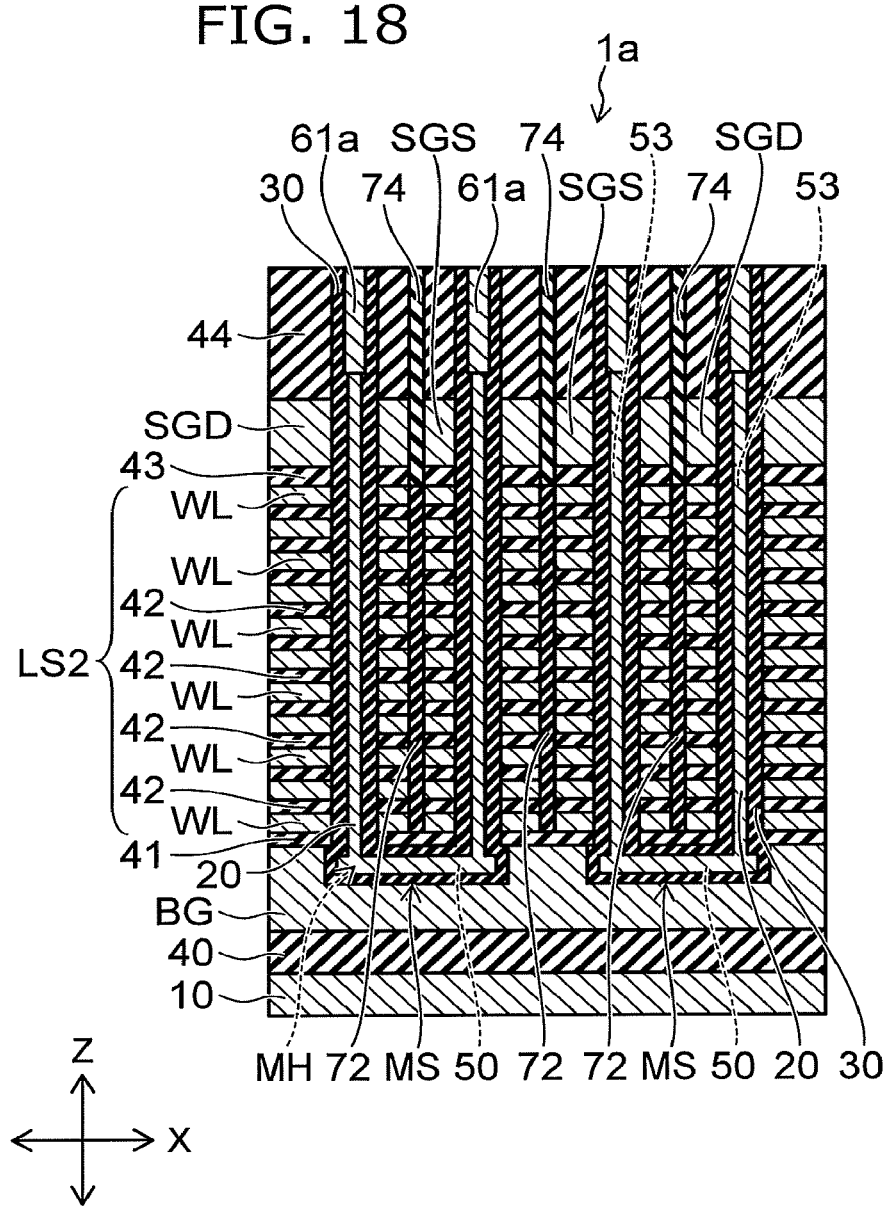
FIG. 18 is a cross-sectional view of the semiconductor device according to the other example of the embodiment.

FIG. 12A to FIG. 17 are process cross-sectional views illustrating the other example of the method for manufacturing the semiconductor device according to the embodiment. FIG. 18 is a cross-sectional view of the semiconductor device 1a according to the other example of the embodiment. FIG. 12A to FIG. 18 illustrate cross sections along the X-direction.

A description is omitted as appropriate for the processes for which similar processes are applicable to components marked with the same reference numerals as those of the manufacturing method described above.

First, processes similar to the processes illustrated in FIGS. 4A to 4C are performed.

Then, the insulating layer 41 is formed on the back gate BG and on the sacrificial layer 46.

Continuing, the conductive layers WL and non-doped silicon layers 47 are stacked alternately on the insulating layer 41. By this process, a stacked body LS2 is formed in which the multiple conductive layers are provided to be separated at a prescribed spacing.

Figure 12A:
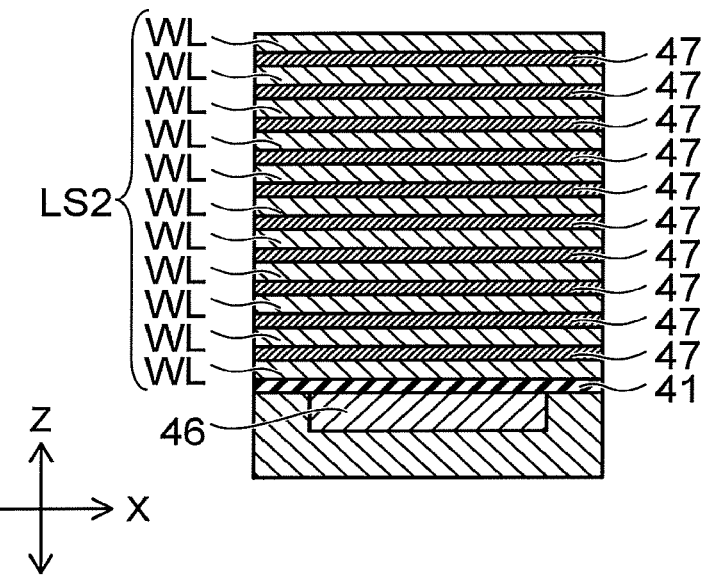

The state at this time is illustrated in FIG. 12A.

For example, the insulating layer 40, the back gate BG, the insulating layer 41, the conductive layers WL, and the non-doped silicon layers 47 are formed by CVD.

The conductive layers WL are, for example, polycrystalline silicon layers to which boron (B) is added as an impurity. In the non-doped silicon layers 47, an impurity that provides conductivity to the silicon layer is not added intentionally; and impurities other than elements caused by the source gases in the film formation substantially are not included.

The non-doped silicon layers 47 function as sacrificial layers and are ultimately replaced with the insulating layers 42 in a process described below. The thicknesses of the non-doped silicon layers 47 are determined so that the insulating layers 42 have thicknesses sufficient to ensure the breakdown voltage between the conductive layers WL.

After forming the stacked structure illustrated in FIG. 12A, a trench that reaches the insulating layer 41 is formed using photolithography and RIE.

Figure 12B:
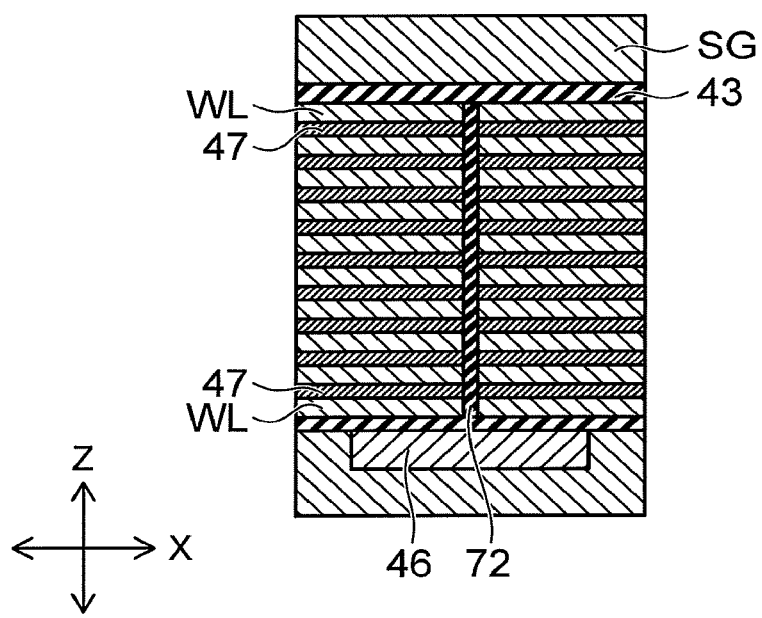

Then, as illustrated in FIG. 12B, the insulating portion 72 is formed inside the trench. The insulating portion 72 includes, for example, silicon oxide or silicon nitride.

Continuing, the insulating layer 43, the select gate SG, and the insulating layer 44 are sequentially formed on the conductive layer WL of the uppermost layer.

Figure 13A:
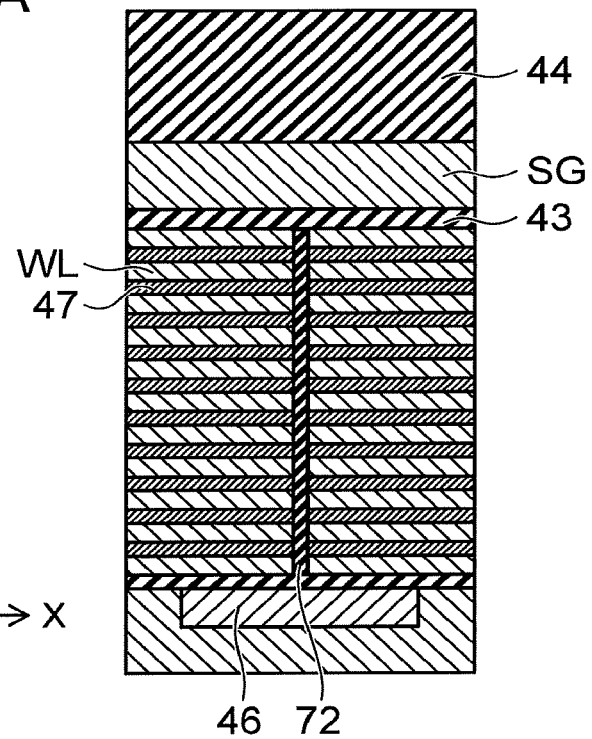

The state at this time is illustrated in FIG. 13A.

Figure 13B:
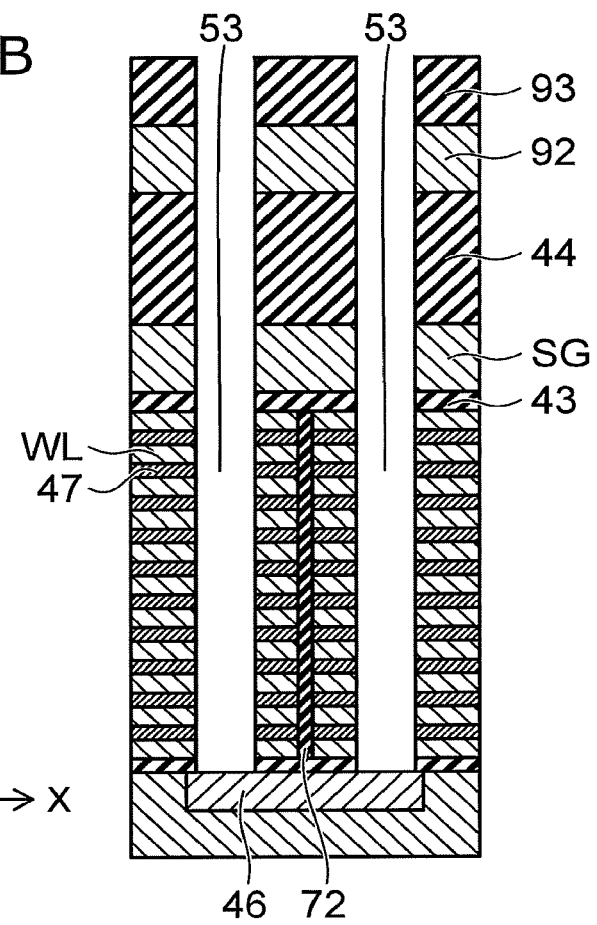

Then, as illustrated in FIG. 13B, the multiple openings 53 are formed in the stacked structure obtained in the processes recited above by using RIE. At this time, two openings 53 are formed on one sacrificial layer 46.

The openings 53 are formed so that the insulating portion 72 is positioned between the two openings 53 provided to correspond to the one sacrificial layer 46. At this time, the side surfaces of the conductive layers WL and the non-doped silicon layers 47 are exposed at the side walls of the openings 53.

After forming the openings 53, the sacrificial layer 46 and the non-doped silicon layers 47 are removed by, for example, wet etching. At this time, an alkaline chemical liquid such as, for example, a KOH solution or the like is used as the etchant.

Figure 14A:
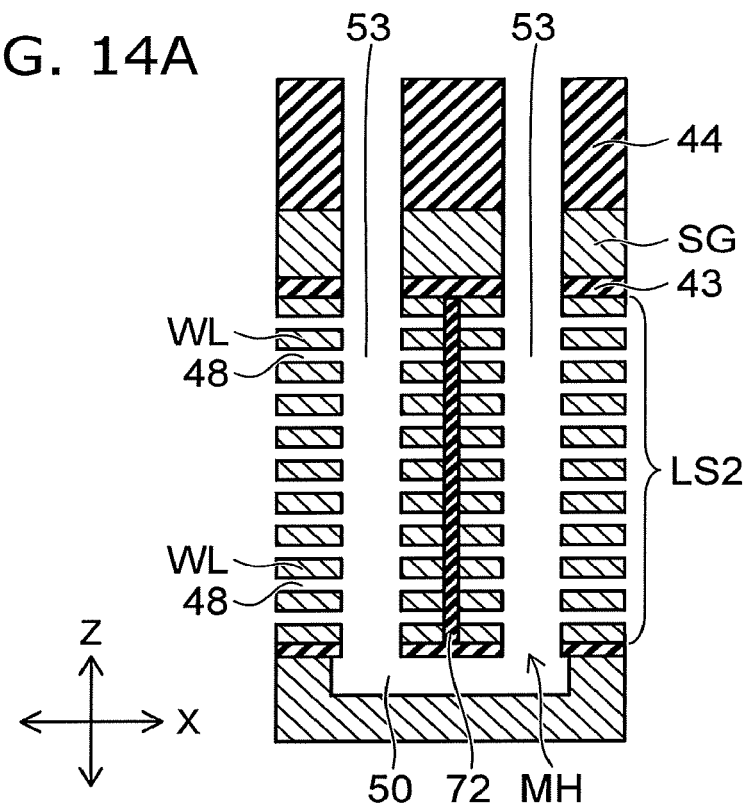

The state at this time is illustrated in FIG. 14A.

At this time, the conductive layers WL are provided with a gap 48 interposed in the Z-direction and are supported by the insulating portion 72. In other words, the stacked body LS2 is supported by the insulating portion 72.

Figure 14B:
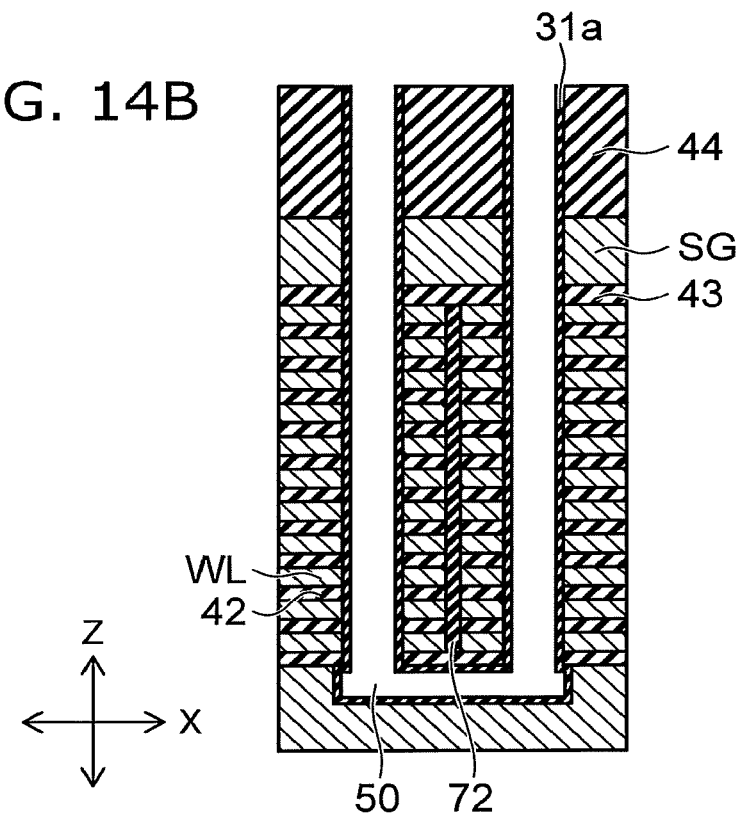

Then, as illustrated in FIG. 14B, the first blocking layer 31a is formed between the mutually-adjacent conductive layers WL, on the side surfaces of the conductive layers WL, and on the inner wall of the trench 50. Here, for example, the first blocking layer 31a can be formed by ALD or CVD.

Figure 15A:
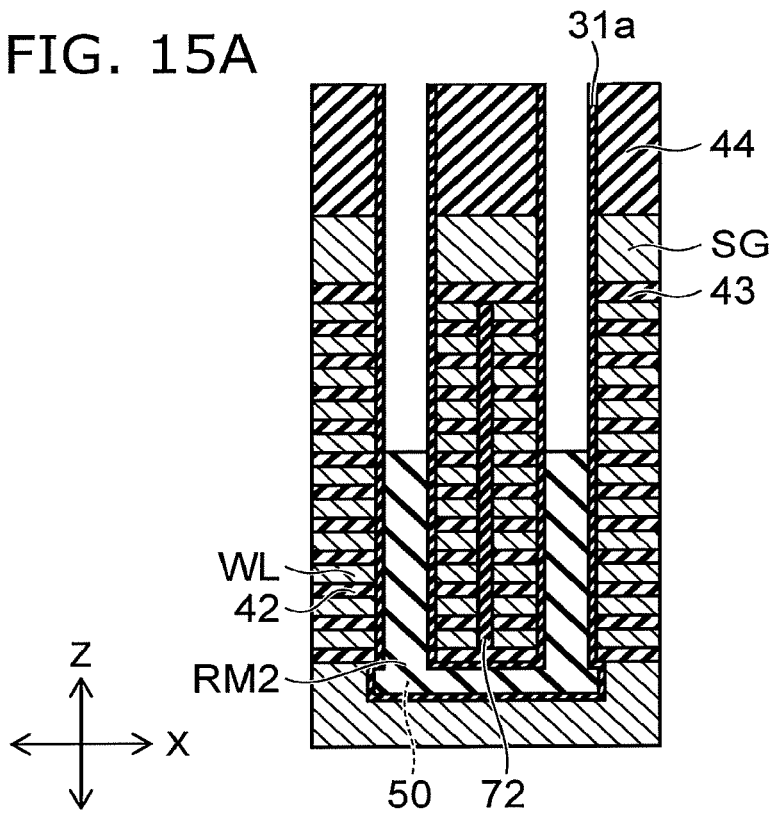

Continuing, a photoresist is formed inside the memory hole MH where the first blocking layer 31a is formed. Subsequently, the resist mask RM2 is formed as illustrated in FIG. 15A.

Figure 15B:
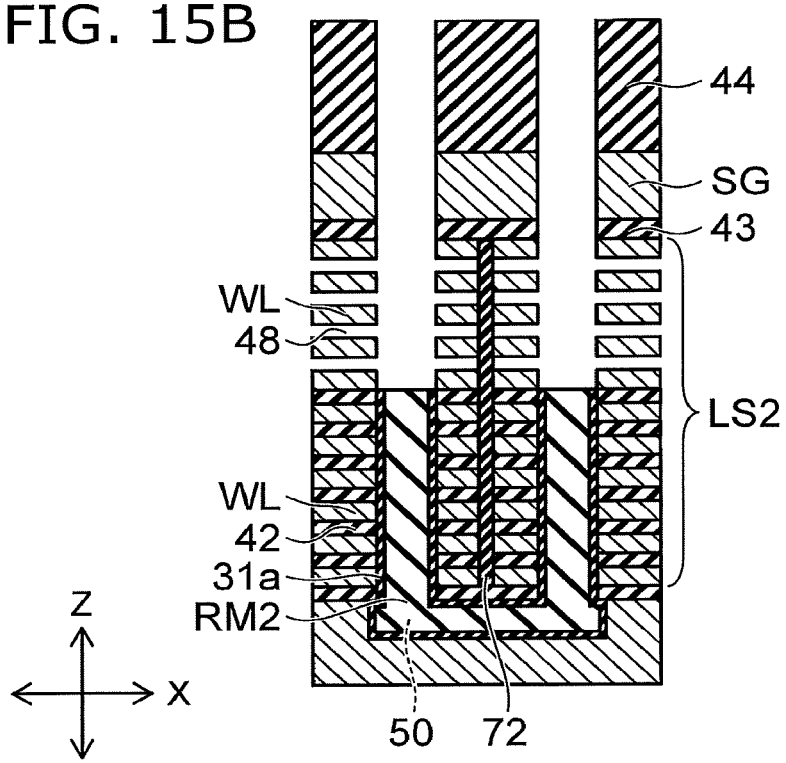
Figure 17:
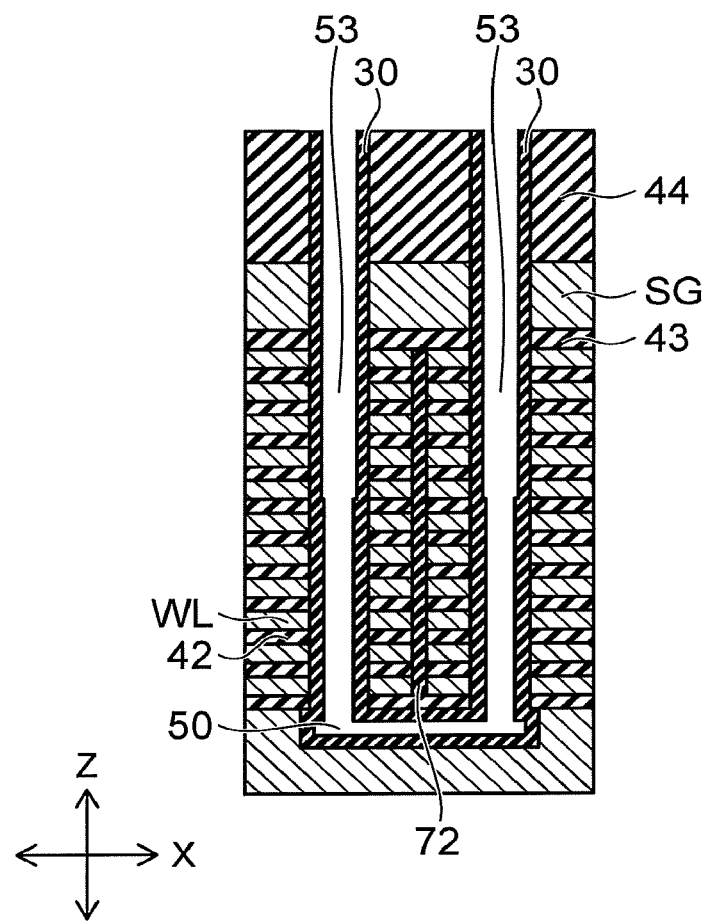

Then, as illustrated in FIG. 15B, the portion of the blocking layer 31a not covered with the resist mask RM2 is removed by, for example, CDE.

By this process, the blocking layer 31a that covers only the side surfaces of the conductive layers at the lower portion of the stacked body LS2 is formed. At this time, the side surfaces of the conductive layers WL at the upper portion of the stacked body LS2 are exposed again. The blocking layer 31a that is provided between the conductive layers WL at the upper portion of the stacked body LS2 also is removed; and the gap 48 reappears.

Then, the resist mask RM2 is removed as illustrated in FIG. 16A.

Continuing as illustrated in FIG. 16B, the second blocking layer 31b is formed inside the memory hole MH. A portion of the second blocking layer 31b is formed on the first blocking layer 31a. Another portion of the second blocking layer 31b is formed between the mutually-adjacent conductive layers WL and on the side surfaces of the conductive layers WL exposed by the removal of the first blocking layer 31a. Here, for example, the second blocking layer 31b can be formed by ALD or CVD.

By this process, the blocking layer 31 is formed so that the thickness of the portion formed on the side surfaces of the conductive layers WL provided at the upper portion of the stacked body LS2 is thicker than the thickness of the portion formed on the side surfaces of the conductive layers WL provided at the lower portion of the stacked body LS2.

Then, as illustrated in FIG. 17A, the memory layer 30 is formed by forming the charge storage layer 32 and the tunneling layer 33 on the blocking layer 31.

Other than the blocking layer 31, the charge storage layer 32 and/or the tunneling layer 33 may be provided between the gaps 48.

According to the height of the gap 48 and/or the thicknesses of the layers included in the memory layer 30, there are also cases where the gap 48 is filled with only the blocking layer 31; and there are also cases where the gap 48 is filled with a stacked film including the blocking layer 31 and the charge storage layer 32 or a stacked film including the blocking layer 31, the charge storage layer 32, and the tunneling layer 33 as the insulating layer 42.

The gap 48 at the lower portion of a stacked body L2 also may be filled with the second blocking layer 31b, a stacked film of the second blocking layer 31b and the charge storage layer 32, etc., in addition to the first blocking layer 31a.

Subsequently, the semiconductor device 1a illustrated in FIG. 18 is obtained by performing processes similar to the processes illustrated in FIG. 10A to FIG. 11 and by forming the channel bodies 20, the conductors 61a, the source line SL, and the bit lines BL.

Here, because the insulating portion 72 is formed in the example of the manufacturing method, the semiconductor device 1a that is made by the manufacturing method differs from the semiconductor device 1 made by the manufacturing method described above in that the insulating portion 72 is included.

As illustrated in FIG. 18, the insulating portion 72 is positioned between the multiple columnar portions CL provided for one linking portion JP.

Operations and effects of the semiconductor device according to the embodiment will now be described.

In the semiconductor device according to the embodiment, the columnar portion CL is, for example, a circle when viewed from the Z-direction; and the dimension in the X-direction or the Y-direction (hereinbelow, called simply the dimension) at the lower portion of the columnar portion CL is smaller than the dimension at the upper portion of the columnar portion CL. In the semiconductor device, the thickness of the portion of the blocking layer 31 provided at the lower portion of the columnar portion CL is thicker than the thickness of the portion of the blocking layer 31 provided at the upper portion of the columnar portion CL.

Here, as a comparative example of the semiconductor device 1 according to the embodiment, a semiconductor device is considered in which the dimension at the lower portion of the columnar portion CL is smaller than the dimension at the upper portion of the columnar portion CL; and the thickness of the blocking layer 31 provided at the lower portion of the columnar portion CL is equal to the thickness of the blocking layer 31 provided at the upper portion of the columnar portion CL. In the semiconductor device according to the comparative example as well, the columnar portion CL is taken to be a circle when viewed from the Z-direction.

In the semiconductor device of the comparative example, when information is stored (a charge is stored) in the charge storage layer 32 by applying a voltage between the channel body 20 and the conductive layers WL, the dimension at the lower portion of the columnar portion CL is smaller than the dimension at the upper portion of the columnar portion CL; therefore, the electric field intensity that is applied to the lower portion of the columnar portion CL is larger than the electric field intensity applied to the upper portion of the columnar portion CL.

When an electric field that exceeds the electric field intensity necessary for storing the charge is applied, degradation of the memory layer 30, e.g., dielectric breakdown of the tunneling layer 33 or the like occurs easily. As a result, operation errors of the semiconductor device 1 occur easily; and the reliability undesirably decreases.

In other words, in the semiconductor device of the comparative example described above, because the electric field exceeding the electric field intensity necessary for storing the information is applied at the lower portion of the columnar portion CL, the likelihood of the degradation of the memory layer 30, etc., becomes high.

Conversely, by setting the thickness of the blocking layer 31 provided at the lower portion of the columnar portion CL to be thicker than the thickness of the blocking layer 31 provided at the upper portion of the columnar portion CL, it is possible to weaken the electric field intensity at the lower portion of the columnar portion CL.

Accordingly, according to the embodiment, it is possible to suppress the degradation of the memory layer 30 when storing the charge in the charge storage layer 32 of the memory layer 30.

To reduce the electric field intensity applied to the lower portion of the columnar portion CL, it also may be considered to increase the thickness of the tunneling layer 33 instead of the blocking layer 31 at the lower portion of the columnar portion CL.

However, the amount of the electrons passing through the tunneling layer 33 when a voltage is applied to the conductive layer WL is greatly affected by the thickness of the tunneling layer 33. Therefore, to suppress the fluctuation of the characteristics between the memory cells at the upper portion of the columnar portion CL and the memory cells at the lower portion of the columnar portion CL, it is desirable to increase the thickness of the blocking layer 31 rather than the tunneling layer 33 at the lower portion of the columnar portion CL.

A semiconductor device 1b according to another embodiment will now be described using FIG. 19 to FIG. 21B.

Figure 19:
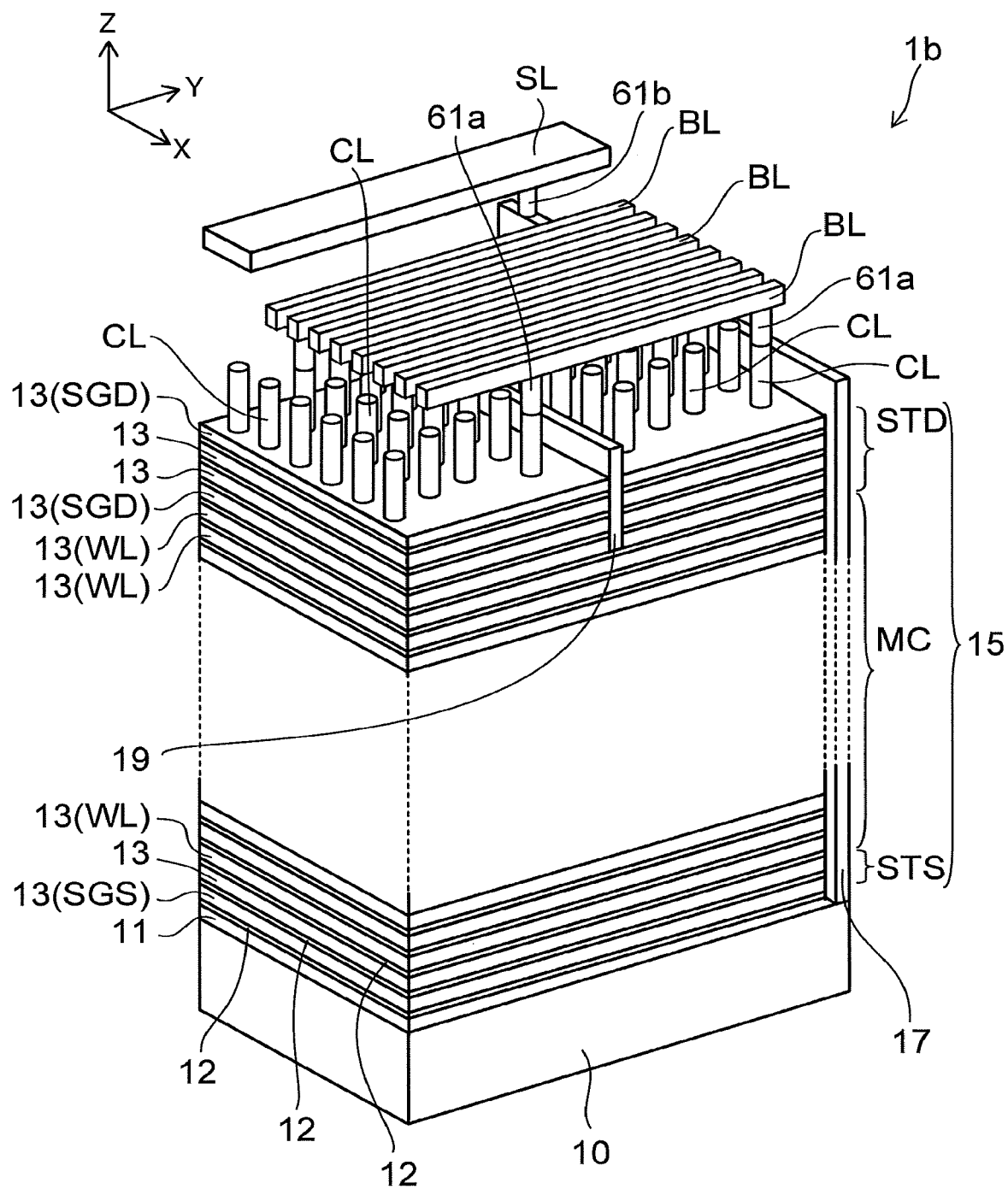
FIG. 19 is a perspective view of the semiconductor device according to an example of the other embodiment.

FIG. 19 is a perspective view of the semiconductor device according to an example of the other embodiment.

Figure 20:
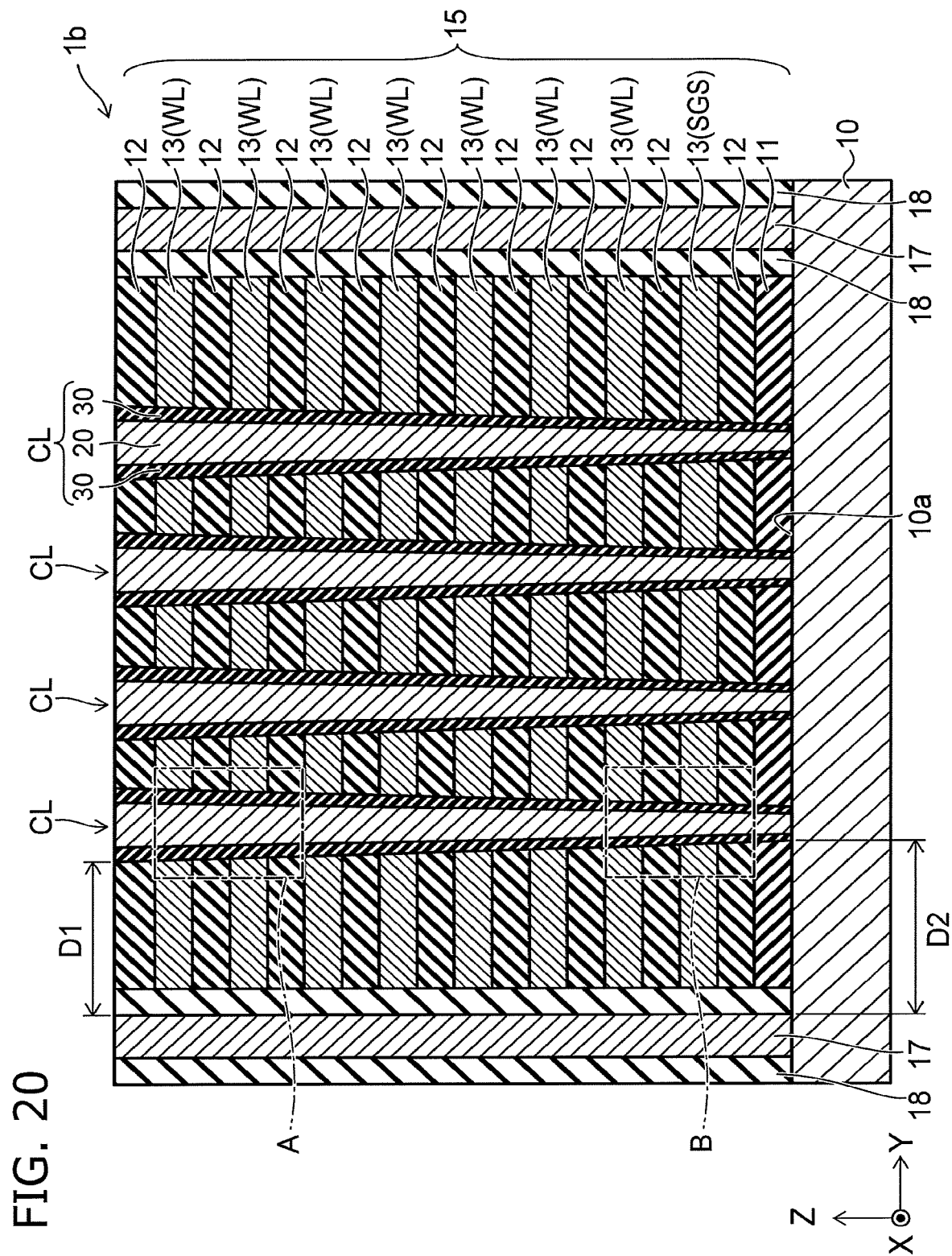
FIG. 20 is a cross-sectional view of the semiconductor device according to the example of the other embodiment.

FIG. 20 is a cross-sectional view of the semiconductor device according to the example of the other embodiment.

FIGS. 21A and 21B are cross-sectional views in which portions of FIG. 20 are enlarged.

As illustrated in FIG. 19 to FIG. 21B, the semiconductor device 1b according to the embodiment includes the substrate 10, a stacked body 15, a source electrode layer 17, an insulating layer 18, an insulating member 19, the conductors 61a and 61b, the columnar portions CL, the source line SL, and the bit lines BL.

The stacked body 15 that is provided on the substrate 10 includes a silicon oxide layer 11, silicon oxide layers 12, and conductive layers 13. The silicon oxide layers 12 and the conductive layers 13 are provided alternately along the Z-direction on the silicon oxide layer 11. The lower end of the source electrode layer 17 is connected to the substrate 10. The stacked body 15 and the source electrode layer 17 are provided alternately in the Y-direction.

As illustrated in FIG. 20, the insulating layer 18 is provided between the stacked body 15 and the source electrode layer 17. The insulating layer 18 includes, for example, silicon oxide. The columnar portions CL extend through the stacked body 15 in the Z-direction. The lower ends of the channel bodies 20 of the columnar portions CL are connected to the substrate 10. The upper ends of the channel bodies 20 are exposed at the upper surface of the stacked body 15.

The source line SL and the bit lines BL are provided on the stacked body 15. The bit lines BL are multiply provided in the X-direction. The source line SL and the multiple bit lines BL extend in the Y-direction. The source line SL is positioned higher than the bit lines BL.

The source line SL is connected to the upper end of the source electrode layer 17 via the conductor 61b. The bit lines BL are connected to the upper ends of the channel bodies 20 via the conductors 61a. Thereby, a current can flow between the bit lines BL and the source line SL via the conductors 61a, the channel bodies 20, the substrate 10, the source electrode layer 17, and the conductor 61b. The channel bodies 20 are connected respectively between the source line SL and the bit lines BL.

In the stacked body 15, one or multiple conductive layers 13 from the top functions as a drain-side select gate SGD. An drain-side select transistor STD is configured at each crossing portion between the drain-side select gate SGD and the columnar portions CL.

One or multiple conductive layers 13 from the bottom functions as a source-side select gate SGS. A source-side select transistor STS is configured at each crossing portion between the source-side select gate SGS and the columnar portions CL.

The conductive layers 13 other than the source-side select gate SGS and the drain-side select gate SGD function as the word lines. A memory cell transistor MC is configured at each crossing portion between the word lines and the columnar portions CL. The multiple memory cell transistors MC are connected in series along each of the channel bodies 20; and the source-side select transistor STS and the drain-side select transistor STD are connected to the two ends of the multiple memory cell transistors MC. Thereby, a NAND string is configured.

A portion of the insulating member 19 is provided inside the upper portion of the stacked body 15 and extends in the X-direction. The portion of the insulating member 19 is positioned between the conductive layers 13 in the Y-direction. The insulating member 19 is made of, for example, silicon oxide. The insulating member 19 does not reach the conductive layers 13 functioning as the word lines. Therefore, two drain-side select gates SGD that are arranged at the same height are disposed on one word line. In other words, the insulating member 19 is provided between the two drain-side select gates SGD arranged at the same height.

FIG. 21A illustrates a cross-sectional view in which the upper portion of the columnar portion CL is enlarged; and FIG. 21B illustrates a cross-sectional view in which the lower portion of the columnar portion CL is enlarged.

In the semiconductor device 1b, similarly to the semiconductor device 1, the memory layer 30 includes the blocking layer 31, the charge storage layer 32, and the tunneling layer 33.

As illustrated in FIG. 20, the width of the lower portion of the columnar portion CL is narrower than the width of the upper portion of the columnar portion CL. In other words, as illustrated in FIG. 21A and FIG. 21B, the width of the lower portion of the blocking layer 31 is narrower than the width of the upper portion of the blocking layer 31. Here, the width means the dimension in the X-direction or the dimension in the Y-direction.

As illustrated in FIG. 20, a distance D1 in the Y-direction between the source electrode layer 17 and the upper portion of one columnar portion CL is longer than a distance D2 in the Y-direction between the source electrode layer 17 and the lower portion of the one columnar portion CL. In other words, the distance in the Y-direction between the insulating layer 18 and the upper portion of one blocking layer 31 is longer than the distance in the Y-direction between the insulating layer 18 and the lower portion of the one blocking layer 31.

At the upper portion of the columnar portion CL as illustrated in FIG. 21A, the outer perimeter surface of the blocking layer 31 is recessed toward the inner side of the columnar portion CL at the positions where the conductive layers 13 are provided. In other words, at the upper portion of the columnar portion CL, a thickness T1 of the blocking layer 31 at the positions overlapping the conductive layers 13 in the X-direction and the Y-direction is thinner than a thickness T2 of the blocking layer 31 at the positions overlapping the silicon oxide layers 12 in the X-direction and the Y-direction.

Similarly, at the lower portion of the columnar portion CL as illustrated in FIG. 21B, the outer perimeter surface of the blocking layer 31 is recessed toward the inner side of the columnar portion CL at the positions where the conductive layers 13 are provided. In other words, at the lower portion of the columnar portion CL, a thickness T3 of the blocking layer 31 at the positions overlapping the conductive layers 13 in the X-direction and the Y-direction is thinner than a thickness T4 of the blocking layer 31 at the positions overlapping the silicon oxide layers 12 in the X-direction and the Y-direction.

The thickness T2 is substantially the same as the thickness T4. The recess of the blocking layer 31 at the upper portion of the columnar portion CL is larger than the recess of the blocking layer 31 at the lower portion of the columnar portion CL. In other words, the thickness T3 is thicker than the thickness T1.

FIG. 22 to FIG. 29 are process cross-sectional views illustrating an example of a method for manufacturing the semiconductor device according to the other embodiment.

FIG. 22 to FIG. 26, FIG. 28, and FIG. 29 show cross sections corresponding to FIG. 20.

Figure 26:
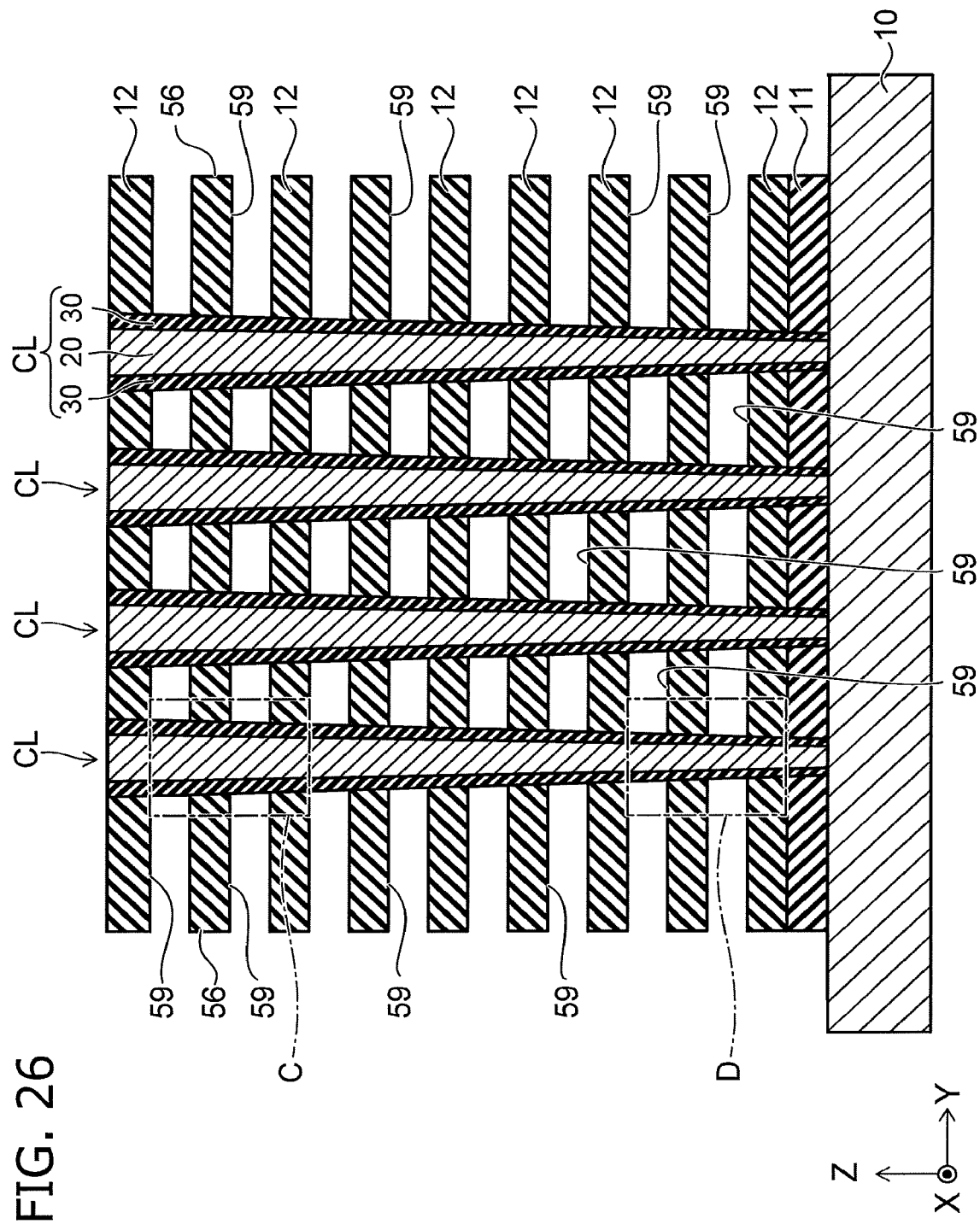
Figure 27A:
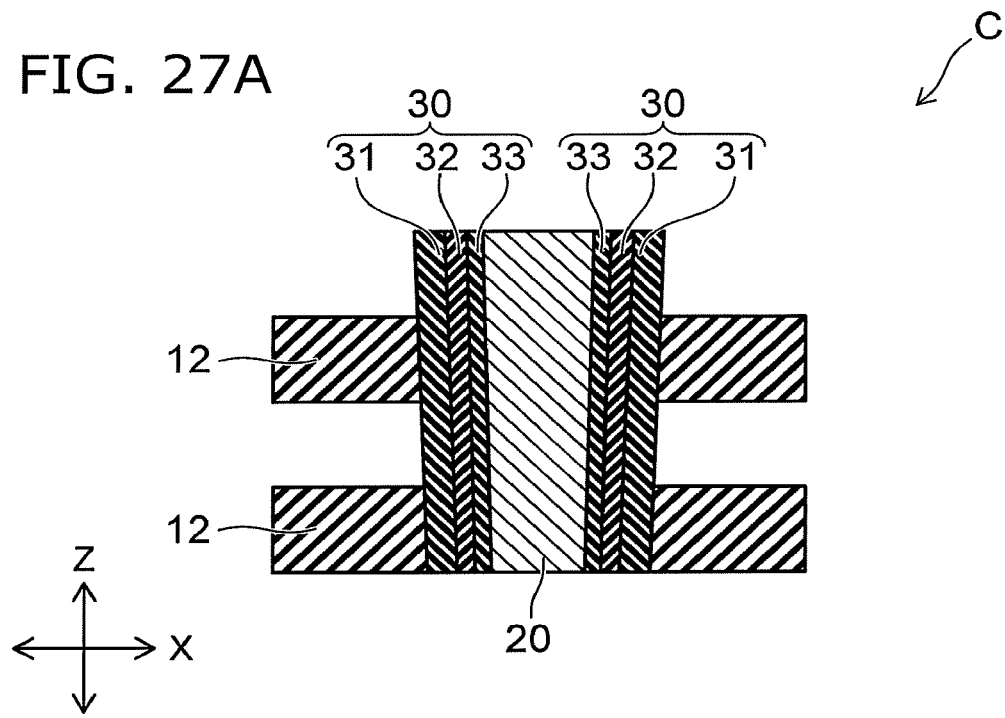
Figure 27B:
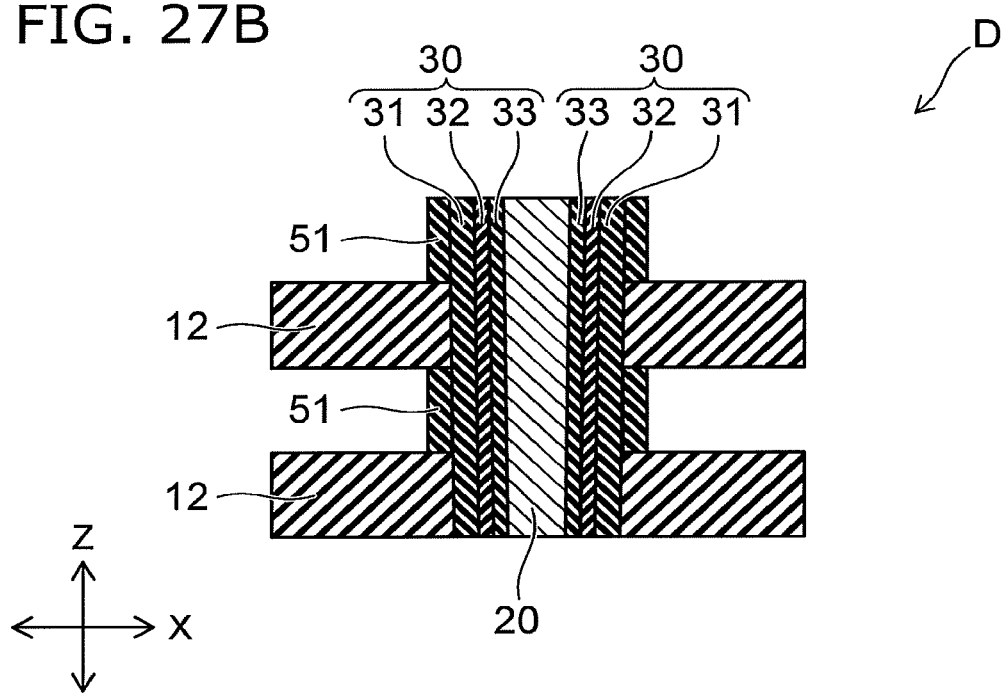

FIG. 27A illustrates a cross-sectional view in which region C of FIG. 26 is enlarged; and FIG. 27B illustrates a cross-sectional view in which region D of FIG. 26 is enlarged.

Figure 22:
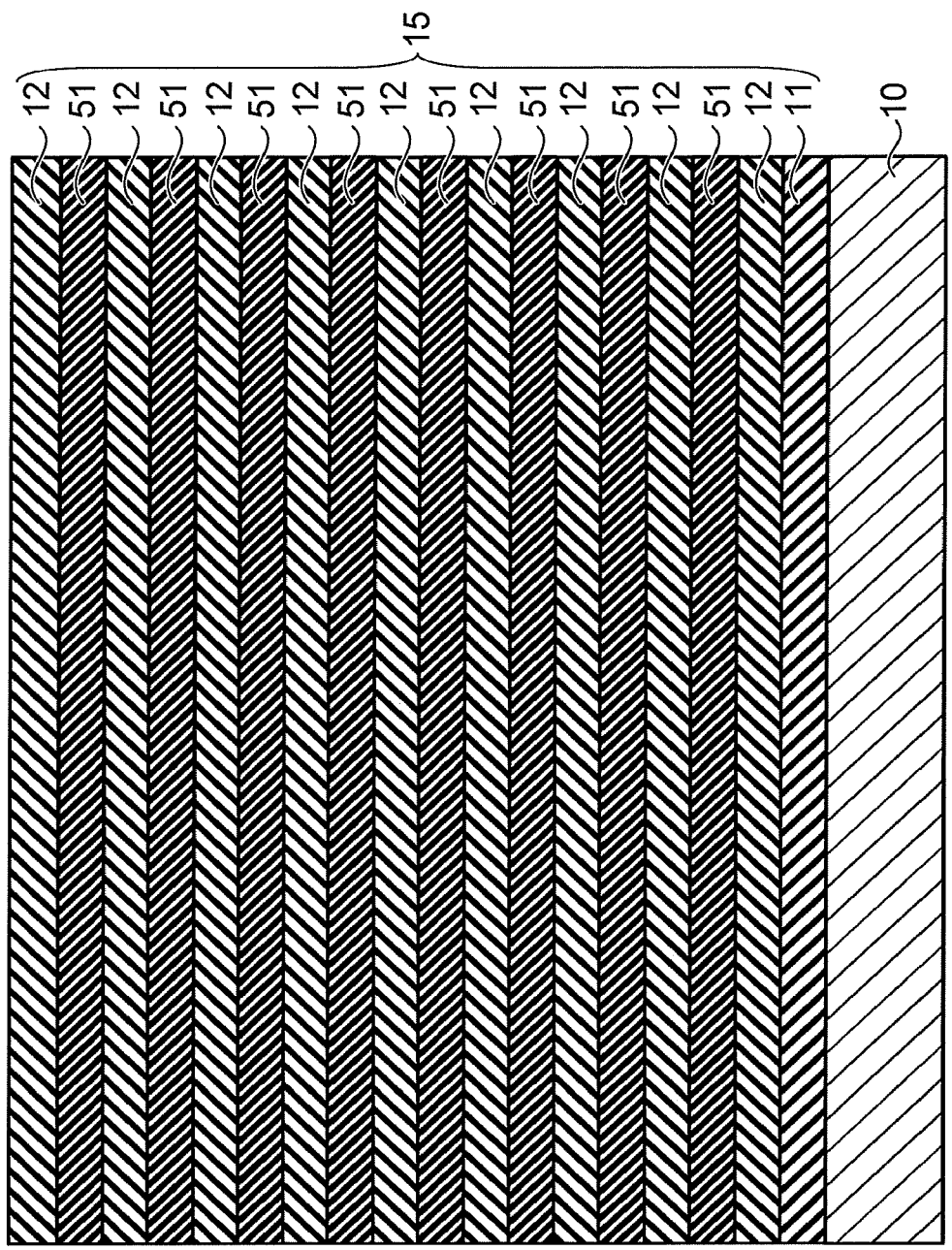
FIG. 22 to FIG. 29 are process cross-sectional views illustrating an example of a method for manufacturing the semiconductor device according to the other embodiment.

The silicon oxide layer 11 is formed on the substrate 10. The silicon oxide layers 12 and the silicon nitride layers 51 are formed alternately on the silicon oxide layer 11; and the stacked body 15 is formed as illustrated in FIG. 22.

Figure 23:
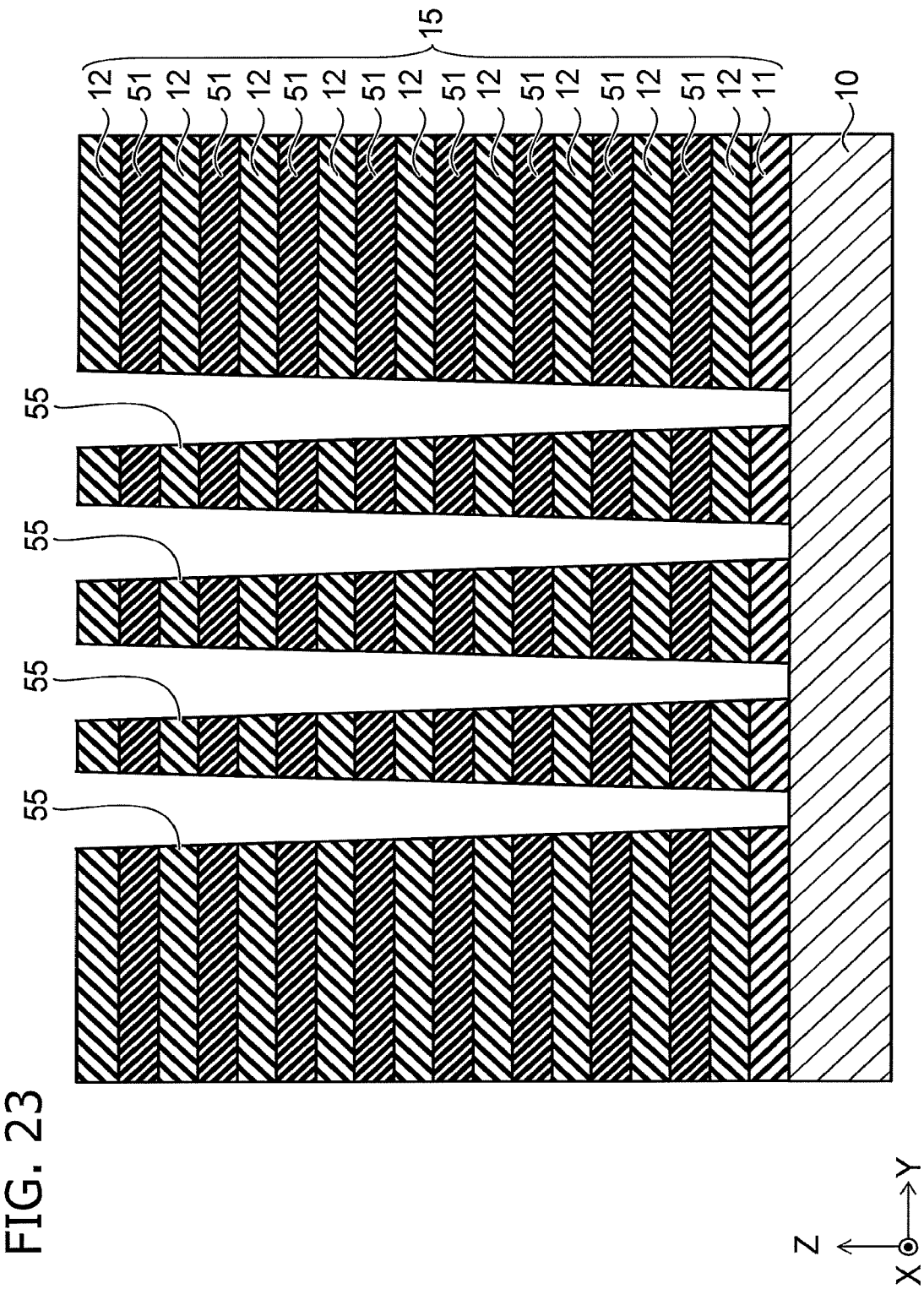

A not-illustrated resist mask (not illustrated) is formed on the stacked body 15 by lithography. Anisotropic etching such as RIE or the like is performed using the resist mask. Thereby, as illustrated in FIG. 23, memory holes 55 are formed in the stacked body 15. The configuration of the memory hole 55 is a substantially circular column extending in the Z-direction. The dimension in the X-direction and the dimension in the Y-direction of the memory hole 55 gradually decrease from the upper portion toward the lower portion of the stacked body 15. The substrate 10 is exposed at the bottom surface of the memory hole 55.

Figure 24:
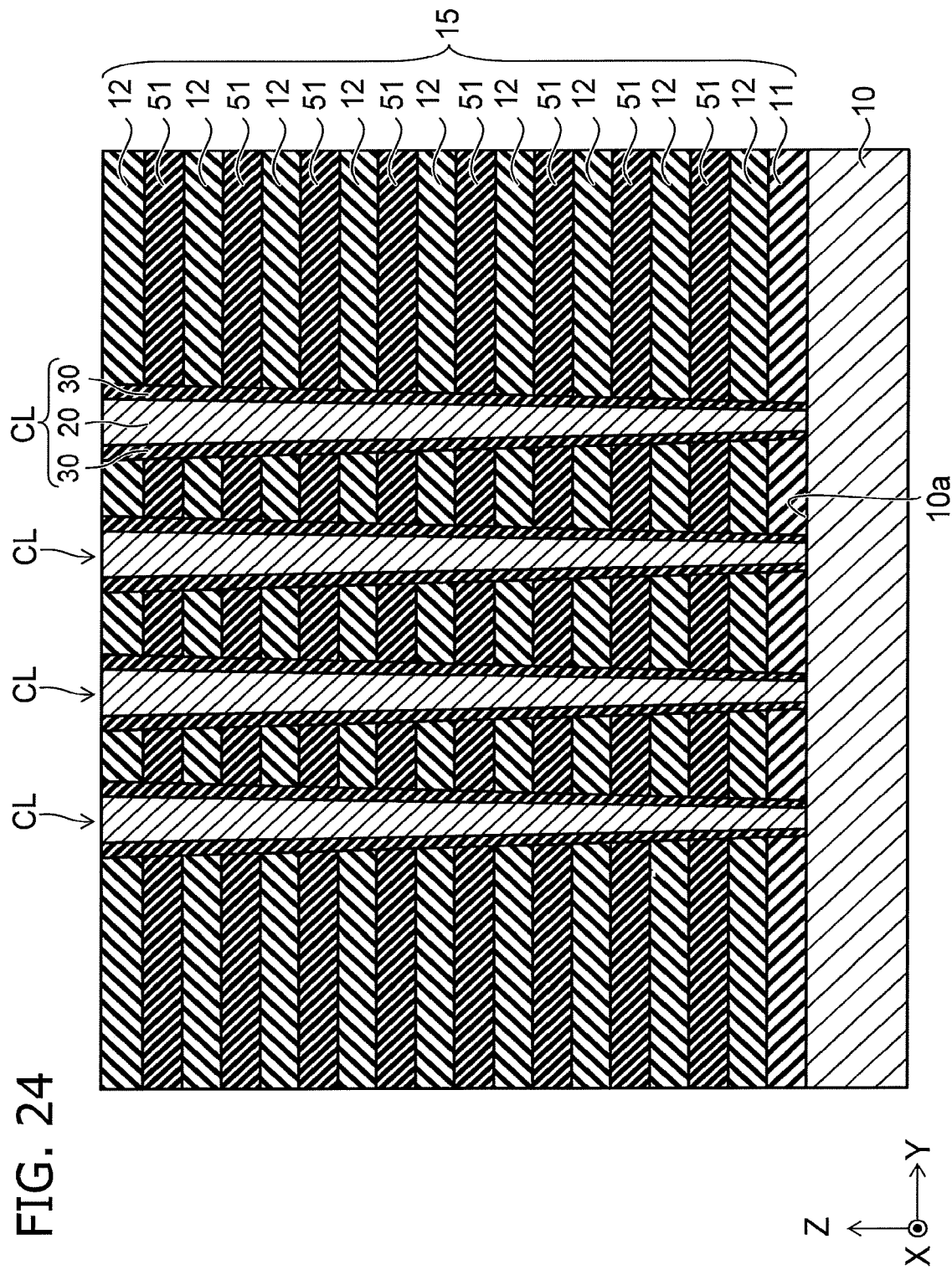

The blocking layer 31, the charge storage layer 32, and the tunneling layer 33 are sequentially formed on the inner wall surface of the memory hole 55. The channel body 20 is formed by depositing a silicon layer on the inner side of the tunneling layer 33. Thereby, as illustrated in FIG. 24, the columnar portion CL that includes the channel body 20 and the memory layer 30 is formed inside the memory hole 55.

Figure 25:
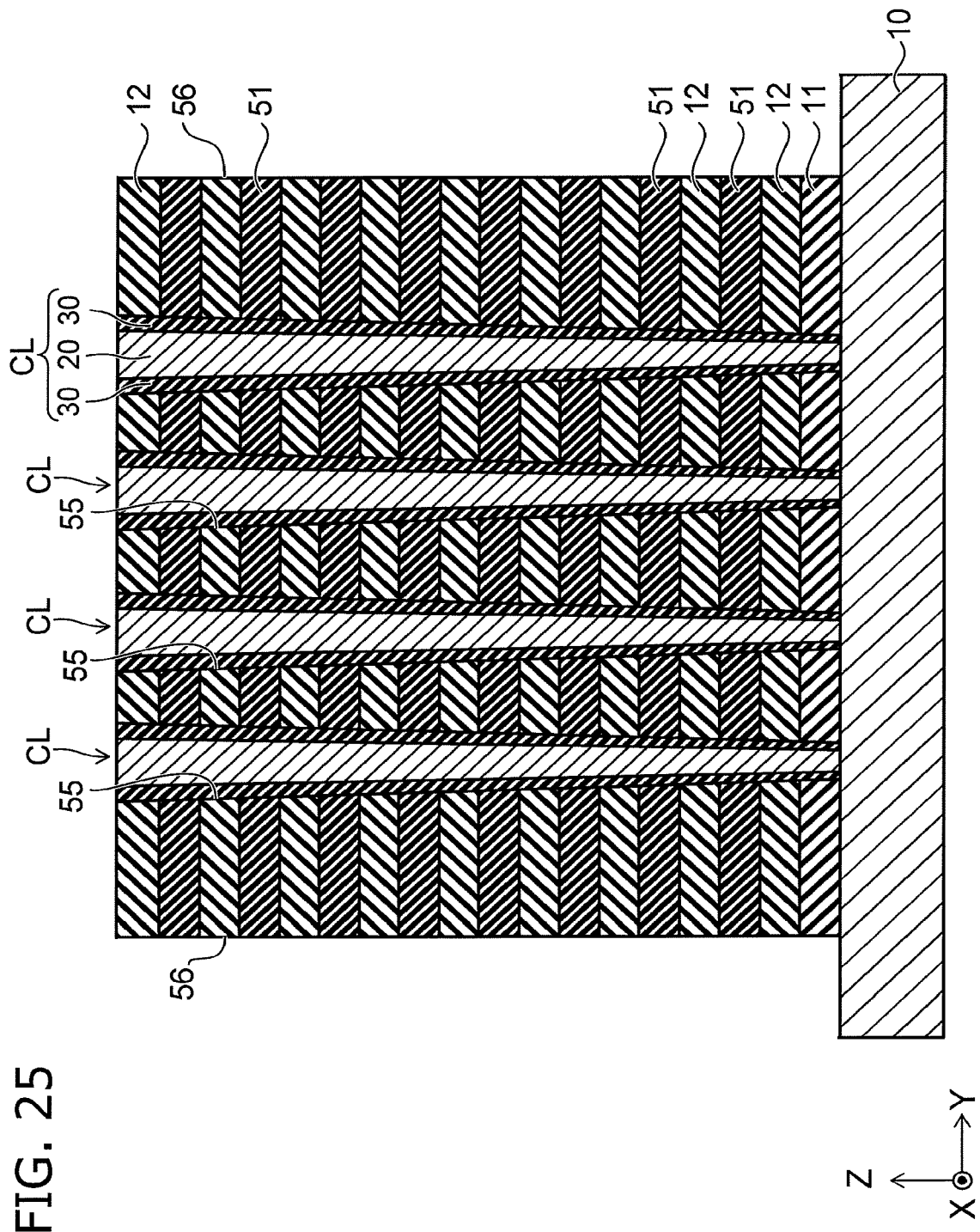

As illustrated in FIG. 25, a slit 56 is formed in the stacked body 15. The slit 56 is formed in a region other than the positions where the columnar portions CL are provided. The slit 56 extends in the X-direction and the Z-direction.

The width of the lower portion of the columnar portion CL is narrower than the width of the upper portion of the columnar portion CL. Therefore, the distance in the Y-direction between the slit 56 and the lower portion of the columnar portion CL is longer than the distance in the Y-direction between the slit 56 and the upper portion of the columnar portion CL.

The configuration of the slit 56 is not limited to the example illustrated in FIG. 25. The width of the lower portion of the slit 56 may be narrower than the width of the upper portion of the slit 56. In such a case, the distance in the Y-direction between the slit 56 and the lower portion of the columnar portion CL is even longer than the distance in the Y-direction between the slit 56 and the upper portion of the columnar portion CL.

As illustrated in FIG. 26, the silicon nitride layers 51 are removed via the slit 56 by performing, for example, wet etching using hot phosphoric acid. Thereby, a space 59 is formed between the silicon nitride layers 51.

The upper portion of the columnar portion CL is more proximal to the slit 56 than is the lower portion of the columnar portion CL. Therefore, in the wet etching, the upper portion of the columnar portion CL is immersed in hot phosphoric acid sooner than the lower portion of the columnar portion CL. The specific state at this time is illustrated in FIGS. 27A and 27B.

When the silicon nitride layers 51 at the upper portion of the stacked body 15 are removed as illustrated in FIG. 27A, the silicon nitride layers 51 at the lower portion of the stacked body 15 are not removed completely as illustrated in FIG. 27B. This is because the thickness of a silicon nitride layer 51 in the Y-direction between the slit 56 and the lower portion of the columnar portion CL is thicker than the thickness of the silicon nitride layer 51 in the Y-direction between the slit 56 and the upper portion of the columnar portion CL.

The outer perimeter surface of the blocking layer 31 at the upper portion of the columnar portion CL is immersed in the hot phosphoric acid and is etched from when the silicon nitride layers 51 at the upper portion of the stacked body 15 are removed until when the silicon nitride layers 51 at the lower portion of the stacked body 15 are removed. As a result, as illustrated in FIG. 21A and FIG. 21B, the thickness of a portion of the blocking layer 31 at the lower portion of the columnar portion CL becomes greater than the thickness of a portion of the blocking layer 31 at the upper portion of the columnar portion CL.

Figure 28:
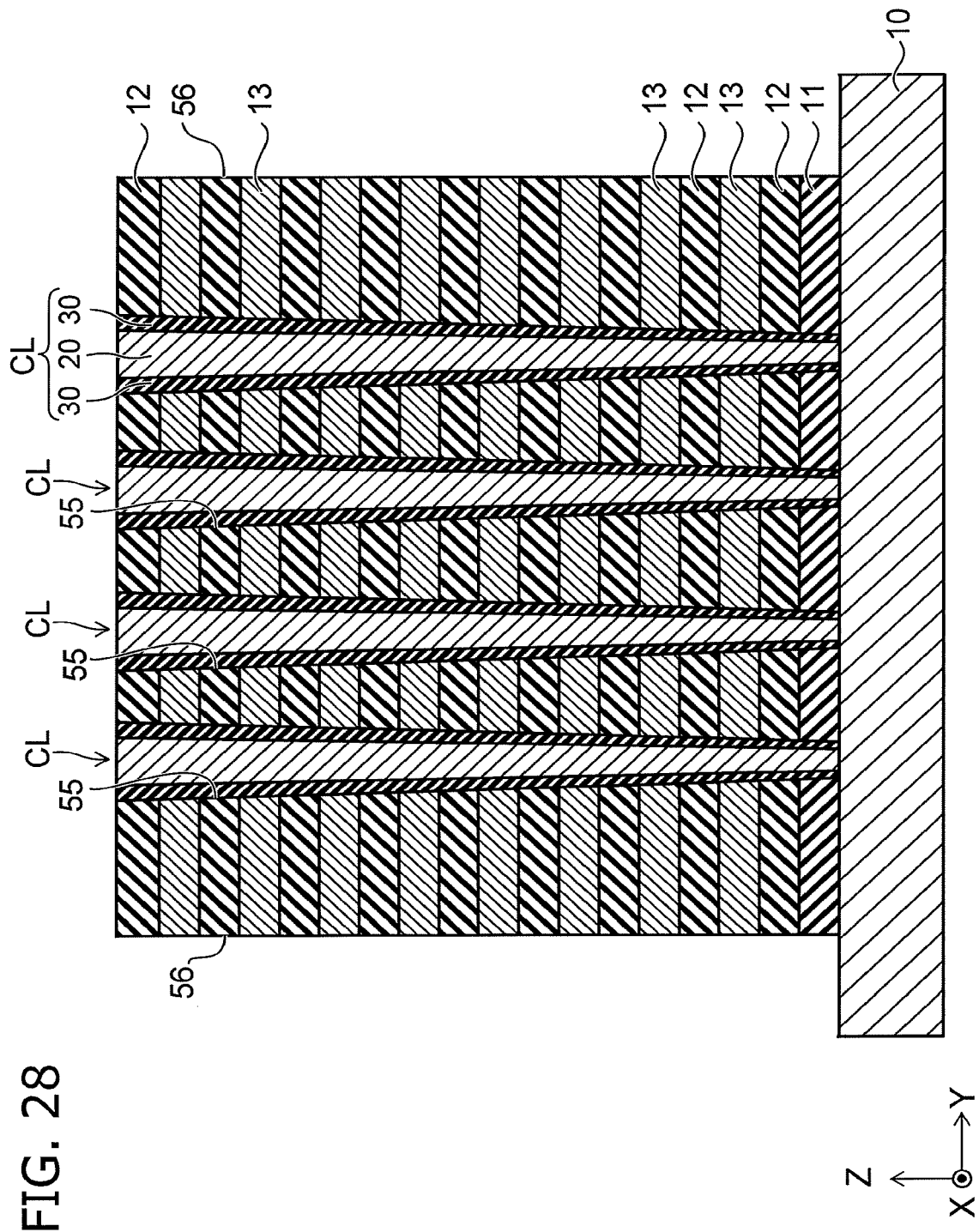

Tungsten is deposited in the space 59 by CVD via the slit 56. A barrier metal or the like may be formed between the tungsten and the memory layer 30 and between the tungsten and the silicon oxide layer 12. When depositing the tungsten in the space 59, the tungsten that is deposited in the slit 56 is removed. Thereby, as illustrated in FIG. 28, the conductive layers 13 are formed between the silicon oxide layers 12.

Figure 29:
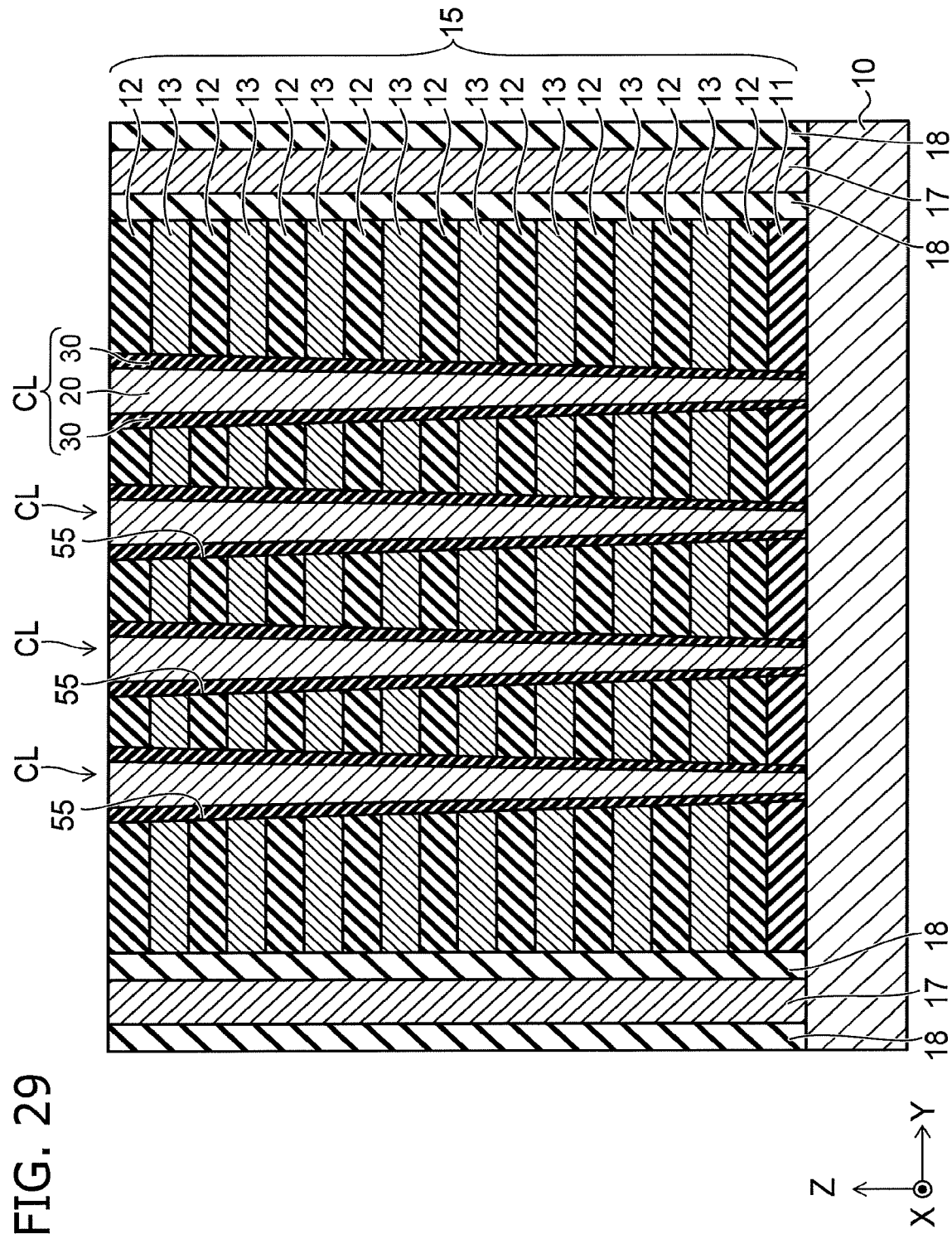

The insulating layer 18 is formed on the side surface of the slit 56 by depositing silicon oxide. As illustrated in FIG. 29, the source electrode layer 17 is formed by depositing a conductive material such as tungsten or the like inside the slit 56.

As illustrated in FIG. 19, the conductors 61a are formed on the columnar portion CL; and the conductor 61b is formed on the source electrode layer 17. The bit lines BL that extend in the Y-direction are formed and connected to the conductors 61a. The source line SL that extends in the Y-direction is formed and connected to the conductor 61b.

By the processes recited above, the semiconductor device 1b according to the embodiment is manufactured.

In the embodiment as described above, at the positions overlapping the conductive layers 13, the thickness of the blocking layer 31 at the lower portion of the columnar portion CL is greater than the thickness of the blocking layer 31 at the upper portion of the columnar portion CL. Therefore, in the embodiment as well, it is possible to weaken the electric field intensity at the lower portion of the columnar portion CL when storing information in the charge storage layer 32.

Also, according to the embodiment, the difference between the electric field intensities at the upper portion and the lower portion of the columnar portion CL can be reduced. Therefore, the difference between the programming voltage to the charge storage layer 32 at the columnar portion CL upper portion and the programming voltage to the charge storage layer 32 at the columnar portion CL lower portion can be reduced; and the programming speed can be increased.

In the semiconductor device 1b according to the embodiment, the width of the columnar portion CL gradually decreases downward from above; similarly, the thickness of the blocking layer 31 of the columnar portion CL overlapping the conductive layer 13 gradually increases downward from above. Therefore, according to the semiconductor device 1b according to the embodiment, compared to the semiconductor device 1, the fluctuation of the electric field intensity at each portion of the columnar portion CL can be reduced further.

Figure 30:
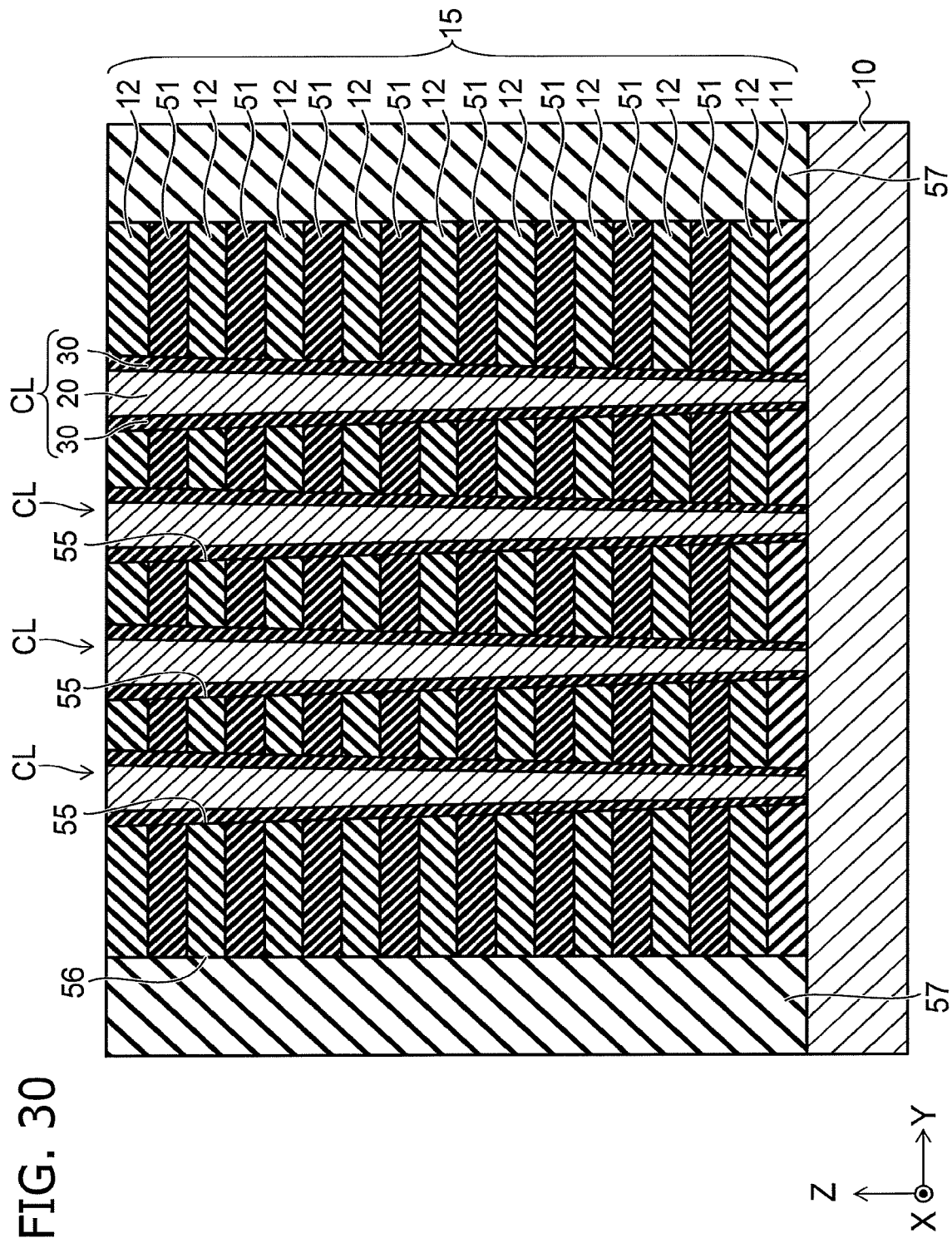
FIG. 30 and FIG. 31 are process cross-sectional views illustrating another example of manufacturing processes of the semiconductor device according to the other embodiment.
Figure 31:
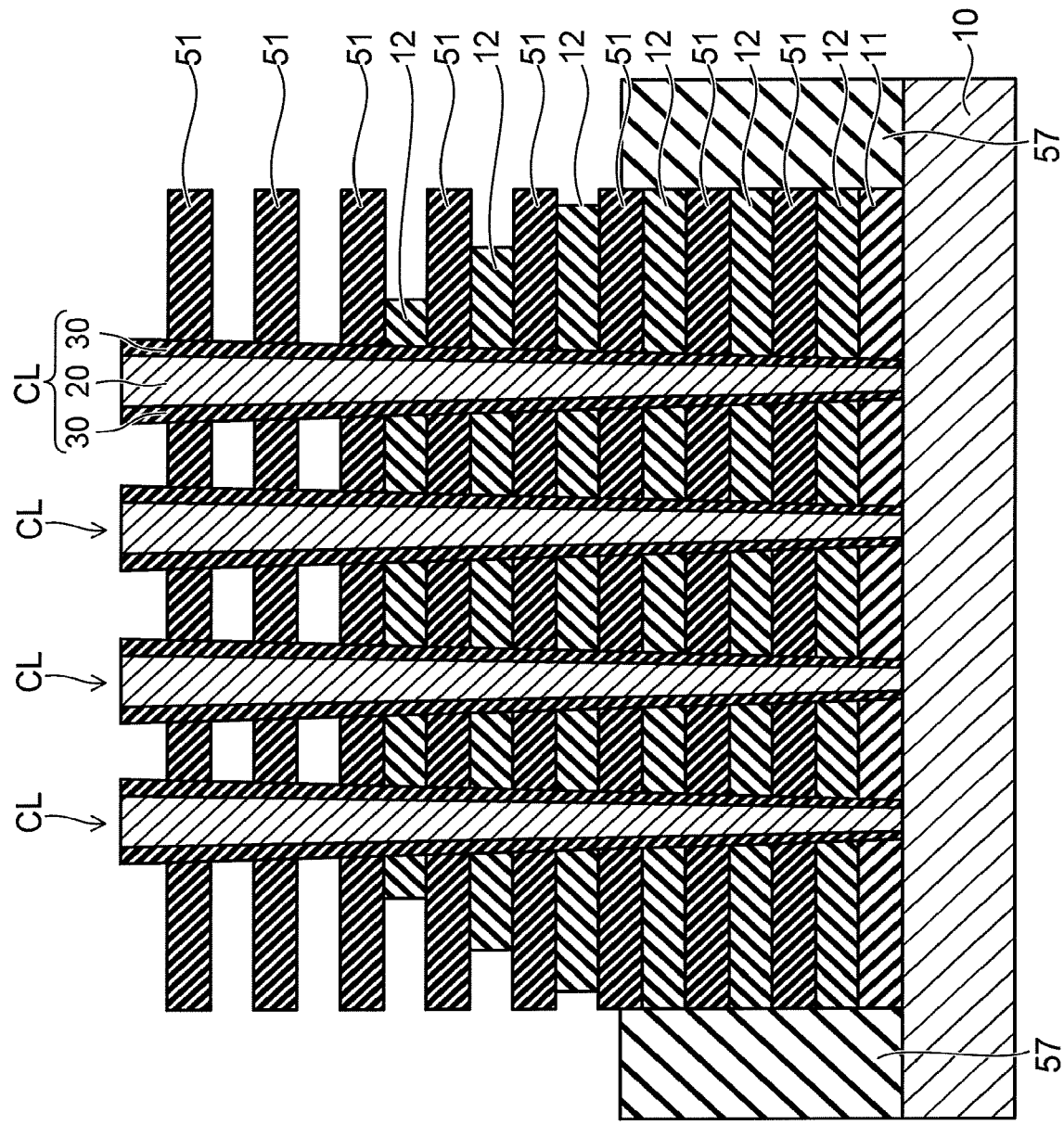

FIG. 30 and FIG. 31 are process cross-sectional views illustrating another example of manufacturing processes of the semiconductor device according to the other embodiment.

FIG. 30 to FIG. 31 show cross sections corresponding to FIG. 20.

Processes similar to the processes illustrated in FIG. 22 to FIG. 25 are performed; and the slit 56 is formed in the stacked body 15. As illustrated in FIG. 29, the slit 56 is filled by forming a silicon nitride layer 57 inside the slit 56.

The configuration of the slit 56 is not limited to the example illustrated in FIG. 29. The width of the upper portion of the slit 56 may be wider than the width of the lower portion of the slit 56. In such a case, the distance in the Y-direction between the slit 56 and the lower portion of the columnar portion CL can be set to be even longer than the distance in the Y-direction between the slit 56 and the upper portion of the columnar portion CL.

The silicon nitride layers 52 and the silicon nitride layer 57 are removed by performing, for example, wet etching using hot phosphoric acid. When the stacked body 15 is immersed in the etchant, the etching progresses from the upper portion of the silicon nitride layer 57. As the etching progresses, the slit 56 that was formed previously appears; and the silicon nitride layers 52 are exposed to the etchant. The exposed silicon nitride layers 52 are etched via the slit 56. In other words, the etching of the silicon nitride layers 52 is performed via the slit 56 in order from the silicon nitride layers 52 positioned at the top.

FIG. 31 illustrates the state when the silicon nitride layers 52 at the upper portion of the stacked body 15 are removed. At this time, the silicon nitride layers 52 remain at the lower portion of the stacked body 15. After the state of FIG. 31, the memory layer 30 (the blocking layer 31) of the columnar portion CL upper portion is etched by the hot phosphoric acid while the silicon nitride layers 52 at the lower portion of the stacked body 15 are etched. Thereby, the thickness of a portion of the blocking layer 31 at the columnar portion CL upper portion becomes smaller than the thickness of a portion of the blocking layer 31 at the columnar portion CL lower portion.

After removing the silicon nitride layers 52 at the stacked body 15 lower portion, similarly to the manufacturing method described above, the semiconductor device 1b is manufactured by forming the conductive layers 13, the insulating layer 18, the source electrode layer 17, the conductors 61a, the conductor 61b, the bit lines BL, and the source line SL.

According to the manufacturing method described above, the thickness of the portion of the blocking layer 31 at the columnar portion CL lower portion overlapping the electrode layers 13 can be even thicker than the thickness of the portion of the blocking layer 31 at the columnar portion CL upper portion overlapping the electrode layers 13. Therefore, even in the case where the selectivity of the silicon nitride layers 52 with respect to the blocking layers 31 is large in the wet etching, the etching amount of the blocking layer 31 at the columnar portion CL upper portion can be set to be large. As a result, the thickness of the portion of the blocking layer 31 overlapping the electrode layers 13 at the columnar portion CL lower portion easily can be set to be thicker than the thickness of the portion of the blocking layer 31 overlapping the electrode layers 13 at the columnar portion CL upper portion.

The embodiment according to the invention may include the following method for manufacturing the semiconductor device.

Method 1

A method for manufacturing a semiconductor device, comprising:

forming a stacked body on a substrate by alternately forming a conductive layer and a first sacrificial layer, a plurality of the conductive layers and a plurality of the first sacrificial layers being formed, the plurality of conductive layers being provided to be separated at a prescribed spacing;

forming a first hole extending in a stacking direction in the stacked body;

forming a first insulating layer inside the first hole;

exposing side surfaces of the plurality of conductive layers by forming a second hole extending in the stacking direction in a location of the stacked body other than a location where the first hole is formed;

removing the plurality of first sacrificial layers via the second hole;

forming a blocking layer between the plurality of conductive layers and on side surfaces of the plurality of conductive layers in the stacked body where the plurality of first sacrificial layers is removed;

forming a charge storage layer on the blocking layer in a first direction crossing the stacking direction;

forming a tunneling layer on the charge storage layer in the first direction; and forming a semiconductor layer on the tunneling layer in the first direction, the forming of the second hole including forming the second hole to cause a diameter of the second hole at a first portion of the stacked body to be larger than a diameter of the second hole at a second portion of the stacked body, the second portion being provided on the substrate side of the first portion, the forming of the blocking layer including forming the blocking layer to cause a thickness formed at the second portion to be thicker than a thickness formed at the first portion.

Method 2

The method according to method 1, wherein the forming of the blocking layer includes:

forming a first layer on the side surfaces of the plurality of conductive layers, the first layer including an insulating material;

exposing the side surfaces of the conductive layers at the first portion by removing a portion of the first layer formed at the first portion of the stacked body; and forming a second layer on the first layer formed at the second portion of the stacked body and on the side surfaces of the conductive layers at the first portion of the stacked body, the second layer including an insulating material, and the blocking layer includes the first layer and the second layer.

Method 3

The method according to method 1, wherein the insulating material included in the second layer is the same as the insulating material included in the first layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
    a substrate;
    a stacked body including a plurality of first conductive layers and a plurality of first insulating layers and being provided on the substrate, the first conductive layers and the first insulating layers being provided alternately along a first direction; and
    a columnar portion extending through the stacked body in the first direction, the columnar portion including
        a blocking layer provided on the plurality of first conductive layers and on the plurality of first insulating layers in a second direction crossing the first direction,
        a charge storage layer provided on the blocking layer in the second direction,
        a tunneling layer provided on the charge storage layer in the second direction, and
        a semiconductor layer provided on the tunneling layer in the second direction,
    the columnar portion including a first portion and a second portion, the second portion being provided on the substrate side of the first portion,
    a width in the second direction of the second portion being smaller than a width in the second direction of the first portion,
    a portion of the blocking layer provided at the second portion being thicker than a portion of the blocking layer provided at the first portion.

2. The device according to claim 1, further comprising:
    a second conductive layer thicker than the first conductive layer;
    a second insulating layer provided on the second conductive layer;
    a third insulating layer; and
    a third conductive layer provided on the third insulating layer, the third conductive layer being thicker than the first conductive layer,
    the stacked body being provided between the second insulating layer and the third insulating layer,
    the columnar portion piercing the second insulating layer and the third insulating layer,
    a portion of the blocking layer provided on the second insulating layer being thicker than a portion of the blocking layer provided on the third insulating layer.

3. The device according to claim 2, further comprising a linking portion,
    a portion of the linking portion being provided between the second conductive layer and the columnar portion,
    a plurality of the columnar portions being provided for one of the linking portions,
    the blocking layer being provided on the second conductive layer at the linking portion,
    the charge storage layer being provided on the blocking layer at the linking portion,
    the tunneling layer being provided on the charge storage layer at the linking portion,
    the semiconductor layer being provided on the tunneling layer at the linking portion,
    a portion of the blocking layer provided at the linking portion being thicker than a portion of the blocking layer provided at the first portion.

4. The device according to claim 3, further comprising an insulating portion extending in the first direction,
    the insulating portion being provided between a plurality of the columnar portions provided for one of the linking portions.

5. The device according to claim 1, wherein the blocking layer includes silicon oxide or a high dielectric constant material.

6. The device according to claim 1, wherein
    the blocking layer includes a first layer and a second layer,
    the first layer includes a first insulating material,
    the second layer includes a second insulating material,
    the first layer is provided at the first portion, and
    the second layer is provided at the first portion and the second portion.

7. The device according to claim 6, wherein the first insulating material is the same as the second insulating material.

8. A semiconductor device, comprising:
    a substrate;
    a stacked body including a plurality of first conductive layers and a plurality of first insulating layers and being provided on the substrate, the first conductive layers and the first insulating layers being provided alternately along a first direction; and
    a columnar portion extending through the stacked body in the first direction, the columnar portion including
        a blocking layer provided on the plurality of first conductive layers and on the plurality of first insulating layers in a second direction crossing the first direction,
        a charge storage layer provided on the blocking layer in the second direction,
            a tunneling layer provided on the charge storage layer in the second direction, and
        a semiconductor layer provided on the tunneling layer in the second direction,
    the blocking layer including a third portion and a fourth portion, the fourth portion being positioned between the third portion and the substrate,
    the third portion overlapping a portion of the plurality of first conductive layers in the second direction,
    the fourth portion overlapping another portion of the plurality of first conductive layers in the second direction,
    a width in the second direction of the fourth portion being smaller than a width in the second direction of the third portion, a thickness in the second direction of the fourth portion being greater than a thickness in the second direction of the third portion.

9. The device according to claim 8, further comprising:
a second conductive layer; and
a second insulating layer provided between the second conductive layer and the plurality of first conductive layers and between the second conductive layer and the plurality of first insulating layers in the second direction,
a distance in the second direction between the fourth portion and the second conductive layer being longer than a distance in the second direction between the third portion and the second conductive layer.

10. The device according to claim 8, wherein
the blocking layer has a first surface facing the plurality of first conductive layers and the plurality of first insulating layers, and
the first surface is recessed toward the semiconductor layer at the third portion and the fourth portion.

11. The device according to claim 10, wherein the first surface is recessed more at the fourth portion than at the third portion.

12. The device according to claim 8, wherein
the blocking layer includes a fifth portion and a sixth portion, the sixth portion being positioned between the fifth portion and the substrate;
the fifth portion overlaps a portion of the plurality of first insulating layers in the second direction;
the sixth portion overlaps another portion of the plurality of first insulating layers in the second direction,
a width in the second direction of the sixth portion is smaller than a width in the second direction of the fifth portion, and
a thickness in the second direction of the sixth portion is substantially equal to a thickness in the second direction of the fifth portion.

13. The device according to claim 12, wherein the thickness in the second direction of the sixth portion is greater than the thickness in the second direction of the fourth portion.

14. A method for manufacturing a semiconductor device, comprising:
forming a conductive layer and a first insulating layer alternately on a substrate, a plurality of the conductive layers and a plurality of the first insulating layers being formed;
exposing side surfaces of the plurality of conductive layers by forming a hole in a stacked body, the stacked body including the plurality of conductive layers and the plurality of first insulating layers, the hole extending in the stacking direction;
forming a blocking layer on the side surfaces of the plurality of conductive layers;
forming a charge storage layer on the blocking layer in a first direction crossing the stacking direction;
forming a tunneling layer on the charge storage layer in the first direction; and
forming a semiconductor layer on the tunneling layer in the first direction,
the forming of the hole including forming the hole to cause a dimension in the first direction of the hole at a first portion of the stacked body to be larger than a dimension in the first direction of the hole at a second portion of the stacked body, the second portion being provided on the substrate side of the first portion,
the forming of the blocking layer including forming the blocking layer to cause a thickness of the blocking layer formed at the second portion of the stacked body to be thicker than a thickness of the blocking layer formed at the first portion of the stacked body.

15. The method according to claim 14, wherein
the forming of the blocking layer includes:
forming a first layer on the side surfaces of the plurality of conductive layers, the first layer including an insulating material;
exposing side surfaces of the plurality of conductive layers by removing a portion of the first layer formed at the first portion of the stacked body; and
forming a second layer on the first layer formed at the second portion of the stacked body and on the side surfaces of the conductive layers at the first portion of the stacked body, the second layer including an insulating material,
the blocking layer including the first layer and the second layer.

16. The method according to claim 15, wherein the insulating material included in the second layer is the same as the insulating material included in the first layer.

* * * * *